(12) United States Patent
Kim

(10) Patent No.: US 8,022,920 B2
(45) Date of Patent: Sep. 20, 2011

(54) ORGANIC LIGHT EMITTING DISPLAY

(75) Inventor: Jongyun Kim, Yongin-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 964 days.

(21) Appl. No.: 11/998,687

(22) Filed: Nov. 29, 2007

(65) Prior Publication Data

US 2008/0246697 A1   Oct. 9, 2008

(30) Foreign Application Priority Data

Apr. 6, 2007 (KR) ........................ 10-2007-0034285

(51) Int. Cl.
*G09G 3/36* (2006.01)
*G09G 3/30* (2006.01)
(52) U.S. Cl. .............. 345/100; 345/76; 345/82; 377/64; 315/169.3
(58) Field of Classification Search .............. 345/76–83, 345/98–100, 204–215, 690–699, 169.1–169.4; 377/64–81
See application file for complete search history.

(56) References Cited

U.S. PATENT DOCUMENTS

| 5,128,974 | A  | * | 7/1992  | Maekawa ........................ 377/81 |
|-----------|----|---|---------|-----------------------------------------|
| 2001/0003418 | A1 |   | 6/2001  | Fujita et al. |
| 2004/0201581 | A1 |   | 10/2004 | Miyazawa |
| 2005/0093464 | A1 | * | 5/2005  | Shin et al. .................. 315/169.1 |
| 2005/0264496 | A1 | * | 12/2005 | Shin ................. 345/76 |
| 2005/0268192 | A1 |   | 12/2005 | Eom |
| 2006/0007073 | A1 |   | 1/2006  | Kwak et al. |
| 2006/0044230 | A1 | * | 3/2006  | Eom ................................ 345/76 |
| 2006/0066532 | A1 | * | 3/2006  | Jeong .............................. 345/76 |
| 2006/0145964 | A1 | * | 7/2006  | Park et al. ....................... 345/76 |
| 2006/0152459 | A1 |   | 7/2006  | Shin |
| 2006/0158394 | A1 | * | 7/2006  | Choi .............................. 345/76 |
| 2006/0186822 | A1 | * | 8/2006  | Park .......................... 315/169.3 |

(Continued)

FOREIGN PATENT DOCUMENTS

JP   2001-337304   12/2001

(Continued)

OTHER PUBLICATIONS

Korean patent abstracts for publication No. 1020040039640 A, published May 12, 2004 in the name of Ik Su Kim.

(Continued)

*Primary Examiner* — Alexander Eisen
*Assistant Examiner* — Patrick F Marinelli
(74) *Attorney, Agent, or Firm* — Christie, Parker & Hale, LLP

(57) ABSTRACT

An organic light emitting display includes: a first shift register which is electrically coupled with a clock line, a negative clock line, and an initial drive line; a first NAND gate which is electrically coupled with the initial drive line, a first light emitting control line which is an output line of the first shift register, and a first clock line; a second NAND gate which is electrically coupled with the initial drive line, the first light emitting control line, and a second clock line; a first pixel part which is electrically coupled with a first scan line which is an output line of the first NAND gate; a second pixel part which is electrically coupled with a second scan line which is an output line of the second NAND gate; a third pixel part which is electrically coupled with the first scan line; and a fourth pixel part which is electrically coupled with the second scan line.

23 Claims, 10 Drawing Sheets

U.S. PATENT DOCUMENTS

| | | | |
|---|---|---|---|
| 2006/0248421 A1* | 11/2006 | Choi | 714/731 |
| 2006/0279510 A1 | 12/2006 | Lai | |
| 2007/0040770 A1* | 2/2007 | Kim | 345/76 |
| 2008/0143706 A1* | 6/2008 | Kim | 345/213 |
| 2008/0170029 A1* | 7/2008 | Kim | 345/100 |
| 2008/0246698 A1* | 10/2008 | Eom | 345/76 |

FOREIGN PATENT DOCUMENTS

| | | |
|---|---|---|
| JP | 2005-031630 | 2/2005 |
| JP | 2005-338773 | 12/2005 |
| JP | 2006-018223 | 1/2006 |
| JP | 2006-154810 | 6/2006 |
| JP | 2006-184871 | 7/2006 |
| JP | 2007-52422 | 3/2007 |
| KR | 10-2004-0039640 | 5/2004 |
| KR | 10-2007-0034800 | 3/2007 |
| KR | 10-2007-0079838 | 8/2007 |

OTHER PUBLICATIONS

Korean patent abstracts for publication No. 1020070034800 A, published Mar. 29, 2007 in the name of Byeong Jae Ahn, et al.

Korean patent abstracts for publication No. 1020070079838 A, published Aug. 8, 2007 in the name of Byeong Jae Ahn, et al.

Japanese Office Action dated Jul. 27, 2010, for corresponding Japanese Application No. 2007-198058, listing the cited reference in this IDS.

* cited by examiner

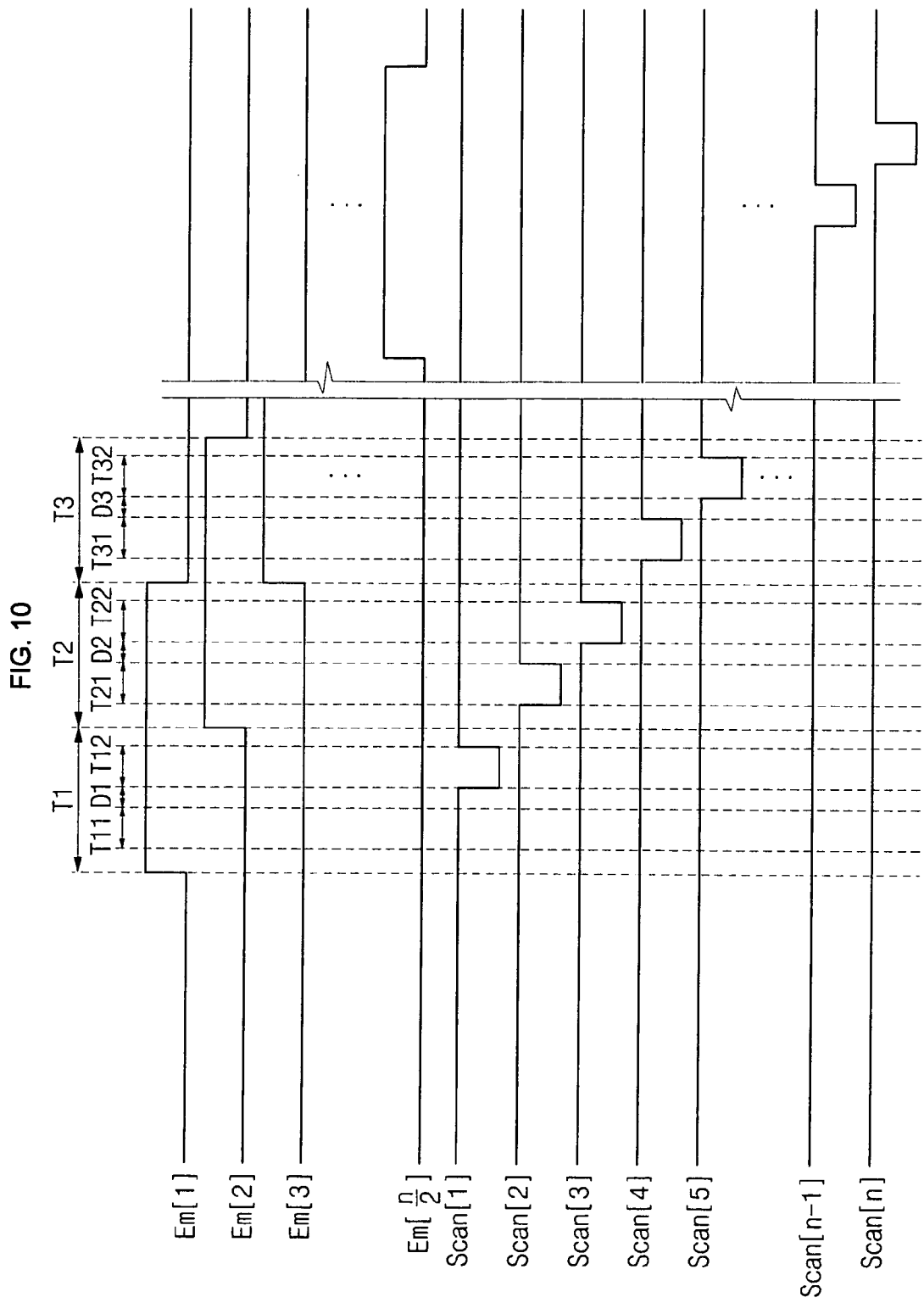

ORGANIC LIGHT EMITTING DISPLAY

CROSS-REFERENCE TO RELATED APPLICATIONS

This application claims priority to and the benefit of Korean Patent Application No. 10-2007-0034285, filed on Apr. 6, 2007, the entire content of which is incorporated herein by reference.

BACKGROUND OF THE INVENTION

1. Field of the Invention

The present invention relates to an organic light emitting display.

2. Description of the Prior Art

An organic light emitting display is a display that emits light by electrically exciting a fluorescent or phosphorescent compound and can display an image by driving N×M organic light emitting diodes. The organic light emitting diode includes an anode (ITO), an organic thin-film, and a cathode (metal). The organic thin-film is formed in a multi-layer structure including a light emitting layer EML that emits light when electrons are coupled with holes, an electron transport layer ETL that transports electrons, and a hole transport layer HTL that transports holes. The organic thin-film can also include an electron injecting layer EIL that injects electrons and a hole injecting layer HIL that injects holes.

As a method of driving the organic light emitting diode constructed as above, there are a passive matrix (PM) method and a metal oxide silicon (MOS) thin-film transistor (TFT) active matrix (AM) method. The passive matrix method is a method of driving using an anode and a cathode that perpendicularly cross each other and selecting lines. On the contrary, the active matrix method is a method of driving by connecting a thin-film transistor and a capacitor to each indium-tin-oxide (ITO) pixel electrode and maintaining a voltage using capacitor capacitance.

The organic light emitting display is used as a display device of a personal computer, a cellular phone and a personal digital assistant (PDA) or a display device of various information appliances.

Various light emitting displays having lower weight and volume than a cathode ray tube have been developed, and an organic light emitting display having excellent light emission efficiency, brightness and viewing angle and fast response time is being given attention.

A pixel circuit of an organic light emitting display is formed on a pixel area that is defined by two adjacent scan lines (or light emitting control lines) and two adjacent data lines. Here, if a scan signal (or light emitting control signal) is applied from two adjacent scan lines (or light emitting control lines), then an organic light emitting diode (OLED) of a pixel circuit emits light. Two adjacent scan lines (or light emitting control lines) electrically coupled with the pixel circuit, in case of an $n^{th}$ pixel circuit, can be an $n^{th}$ scan line (or light emitting control line) and an $n-1^{th}$ scan line (or light emitting control line). The scan line (or light emitting control line) electrically coupled with the pixel circuit applies a scan signal (or light emitting control signal) to an organic light emitting diode (OLED) of the pixel circuit, so that the organic light emitting diode (OLED) of the pixel circuit emits light and outputs images of one frame to a panel. However, because the images of one frame emit light concurrently in the organic light emitting display, it is possible to detect a pixel short only when a constant pattern is applied.

In a conventional pixel circuit, the short can be detected by applying a constant pattern to an organic light emitting display panel in a module process. However, a module process operation cost for a defective panel having a short is additionally needed. When a total inspection is not performed during the module process, reliability of the product is lowered because a longitudinal short cannot be detected as a defect during manufacturing, such that the defect is discovered by the end user of the product.

SUMMARY OF THE INVENTION

An aspect of an exemplary embodiment according to the present invention is to provide an organic light emitting display that reduces a module process cost by detecting longitudinal short defects of pixel circuits of an organic light emitting display panel in advance and has high reliability.

An organic light emitting display according to an exemplary embodiment of the present invention includes a first shift register electrically coupled with an initial clock line, an initial negative clock line and an initial drive line, a second shift register electrically coupled with the initial negative clock line, the initial clock line and a first light emitting control line which is an output line of the first shift register, a first NAND gate electrically coupled with the initial drive line, the first light emitting control line and a first clock line, a second NAND gate electrically coupled with the first light emitting control line, a second light emitting control line which is an output line of the second shift register and a second clock line, a first pixel part electrically coupled with a first scan line which is an output line of the first NAND gate, a second pixel part electrically coupled with a second scan line which is an output line of the second NAND gate, a third pixel part electrically coupled with the first scan line, and a fourth pixel part electrically coupled with the second scan line.

The first shift register may have an input terminal electrically coupled with the initial drive line, a first clock terminal electrically coupled with the initial clock line, a second clock terminal electrically coupled with the initial negative clock line, and an output terminal electrically coupled with the first light emitting control line.

The second shift register may have an input terminal electrically coupled with the first light emitting control line, a first clock terminal electrically coupled with the initial negative clock line, a second clock terminal electrically coupled with the initial clock line, and an output terminal electrically coupled with the second light emitting control line.

The first NAND gate may be electrically coupled with the initial drive line, the first light emitting control line, and the first clock line, and may output a first scan signal to the first scan line using an initial drive signal, a first light emitting control signal, and a first clock signal.

The second NAND gate may be electrically coupled with the first light emitting control line, the second light emitting control line, and the second clock line, and may output a second scan signal to the second scan line using a first light emitting control signal, a second light emitting control signal, and a second clock signal.

The first pixel part may be electrically coupled with a $-1^{th}$ scan line, the first scan line and the first light emitting control line.

The second pixel part may be electrically coupled with a $0^{th}$ scan line, the second scan line and the second light emitting control line.

The third pixel part may be electrically coupled with the first scan line, a third scan line and the first light emitting control line.

The fourth pixel part may be electrically coupled with the second scan line, a fourth scan line and the second light emitting control line.

A pixel circuit of at least one of the first pixel part, the second pixel part, the third pixel part, or the fourth pixel part may include a first switching element that is electrically coupled between a first power supply voltage line and a data line and having a control electrode electrically coupled to a scan line, a second switching element that is electrically coupled between the first switching element and the first power supply voltage line and having a control electrode electrically coupled to a light emitting control line, a drive transistor that is electrically coupled between the first switching element and a second power supply voltage line, a first storage capacitor that is electrically coupled between the first power supply voltage line and a third power supply, a second storage capacitor that is electrically coupled between the scan line and a control electrode of the drive transistor, a third switching element that is electrically coupled between the drive transistor and the second power supply voltage line and having a control electrode electrically coupled with the light emitting control line, a fourth switching element that is electrically coupled between the first storage capacitor and the third power supply voltage line and having a control electrode electrically coupled with a second previous scan line, a fifth switching element that is electrically between the control electrode of the drive transistor and the third switching element, and an organic light emitting diode that is electrically coupled between the third switching element and the second power supply voltage line.

The first switching element may have a first electrode electrically coupled with the data line, a second electrode electrically coupled with the second switching element and the drive transistor, and a control electrode electrically coupled with the scan line.

The second switching element may have a first electrode electrically coupled with the first switching element and the drive transistor, a second electrode electrically coupled with the first power supply voltage line and the first storage capacitor, and a control electrode electrically coupled with the light emitting control line.

The third switching element may have a first electrode electrically coupled with the drive transistor and the fifth switching element, a second electrode electrically coupled with an anode of the organic light emitting diode, and a control electrode electrically coupled with the light emitting control line.

The fourth switching element may have a first electrode electrically coupled with the first storage capacitor and the control electrode of the drive transistor, a second electrode electrically coupled with the third power supply voltage line, and a control electrode electrically coupled with a second previous scan line.

The fifth switching element may have a first electrode electrically coupled with the control electrode of the drive transistor, a second electrode electrically coupled with the drive transistor and the third switching element, and a control electrode electrically coupled with the scan line.

The drive transistor may have a first electrode electrically coupled with the first switching element and the second switching element, a second electrode electrically coupled with a first electrode of the third switching element, and a control electrode electrically coupled with the light emitting control line.

At least one of the shift registers may include a first PMOS switching element that has a control electrode electrically coupled with the clock line and adapted to switch a first power supply voltage, a second PMOS switching element that is electrically coupled between the first PMOS switching element and a first node and having a control electrode electrically coupled with an input line, a first NMOS switching element that has a control electrode electrically coupled with the negative clock line and adapted to switch a second power supply voltage, a second NMOS switching element that is electrically coupled between the first NMOS switching element and the first node and having a control electrode electrically coupled with the input line, a third PMOS switching element that has a control electrode electrically coupled with the negative clock line and adapted to switch the first power supply voltage, a fourth PMOS switching element that is electrically coupled between the third PMOS switching element and the first node and having a control electrode electrically coupled with a second node, a third NMOS switching element that has a control electrode electrically coupled with the clock line and adapted to switch the second power supply voltage, a fourth NMOS switching element that is electrically coupled between the third NMOS switching element and the first node and having a control electrode electrically coupled with the second node, a fifth PMOS switching element that is electrically coupled between the first power supply voltage line and the second node and having a control electrode electrically coupled with the first node, and a fifth NMOS switching element that is electrically coupled between the second power supply voltage line and the second node and having a control electrode electrically coupled with the first node.

A signal of the second node may be an output signal of the shift register.

The organic light emitting display may include a clock inverter that is electrically coupled with the initial clock line and adapted to provide an initial negative clock signal to the initial negative clock line using an initial clock signal.

The first clock line may be electrically coupled with an odd-numbered NAND gate among the NAND gates.

When a first clock signal of a low level is applied to the first clock line and a second clock signal of a high level is applied to the second clock line, a scan signal of a low level may be applied to an odd-numbered pixel circuit of the pixel parts, so that a data signal may be applied to the odd-numbered pixel circuit.

When a light emitting control signal of a low level is applied to the odd-numbered pixel circuit, the odd-numbered pixel circuit can emit light.

The second clock line may be electrically coupled with an even-numbered NAND gate among the NAND gates.

When a first clock signal of a high level is applied to the first clock line and a second clock signal of a low level is applied to the second clock line, a scan signal of a low level may be applied to an even-numbered pixel circuit of the pixel parts, so that a data signal may be applied to the even-numbered pixel circuit.

When a light emitting control signal of a low level is applied to the even-numbered pixel circuit, the even-numbered pixel circuit can emit light.

As described above, according to the organic light emitting display of an exemplary embodiment of the present invention, such a desirable effect is attained that it is possible to reduce a module process cost by detecting longitudinal short defect of a pixel circuit of an organic light emitting display panel in advance and it is possible to have high reliability.

BRIEF DESCRIPTION OF THE DRAWINGS

The above and other aspects and features of the present invention will be more apparent from the following detailed description taken in conjunction with the accompanying drawings, in which:

FIG. 10 is a timing diagram illustrating signals of the organic light emitting display of FIG. 9.

DETAILED DESCRIPTION

Hereinafter, exemplary embodiments of the present invention will be described in detail with reference to the accompanying drawings.

It should be understood that electrical coupling between a certain element and another element includes direct electrical coupling between them as well as indirect electrical coupling between them by an interposed element.

Figure 1:
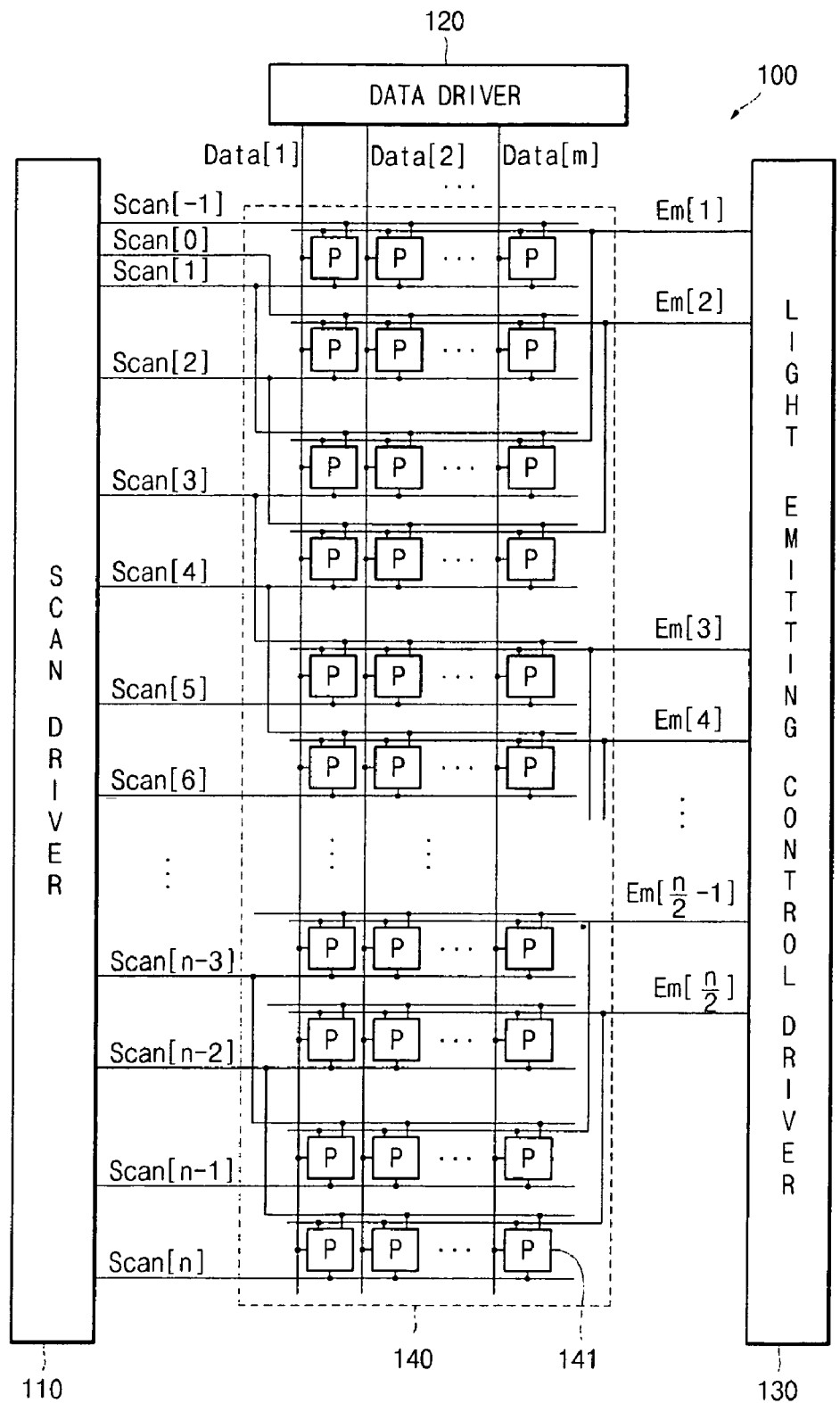
FIG. 1 is a schematic block diagram illustrating an organic light emitting display according to an exemplary embodiment of the present invention.

FIG. 1 illustrates a schematic block diagram of an organic light emitting display according to an exemplary embodiment of the present invention.

As illustrated in FIG. 1, an organic light emitting display 100 in one exemplary embodiment includes a scan driver 110, a data driver 120, a light emitting control driver 130 and an organic light emitting display panel 140 (hereinafter, referred to as a "panel").

The scan driver 110 can sequentially supply scan signals to the panel 140 through a plurality of scan lines (Scan[1], Scan[2], . . . , and Scan[n]).

The data driver 120 can supply data signals to the panel 140 through a plurality of data lines (Data[1], Data[2], . . . , and Data[m]).

The light emitting control driver 130 can supply light emitting control signals to the panel 140 through a plurality of light emitting control lines (Em[1], Em[2], . . . , and Em[n]). Furthermore, the light emitting control driver 130 is capable of adjusting a pulse width of light emitting control signals and can adjust the number of light emitting control signals produced in one section (e.g., one period). Pixel circuits 141 coupled with the light emitting control lines (Em[1], Em[2], . . . , and Em[n]), are supplied with respective light emitting control signals and can determine the time for allowing the current produced in the pixel circuits 141 to flow to respective light emitting diodes.

Furthermore, the panel 140 can include a plurality of scan lines (Scan[1], Scan[2], . . . , and Scan[n]) and a plurality of light emitting control lines (Em[1], Em[2], . . . , and Em[n]) that are arranged in a row direction, a plurality of data lines (Data[1], Data[2], . . . , and Data[m]) that are arranged in a column direction, and pixel circuits 141 that are defined by the scan lines (Scan[1], Scan[2], . . . , and Scan[n]), the data lines (Data[1], Data[2], . . . , and Data[m]) and the light emitting control lines (Em[1], Em[2], . . . , and Em[n]).

An odd-numbered pixel can be formed on a pixel area that is defined by two data lines adjacent to an odd-numbered scan line (or an odd-numbered light emitting control line), and an even-numbered pixel can be formed on a pixel area that is defined by two data lines adjacent to an even-numbered scan line (or an even-numbered light emitting control line). As described above, the scan lines (Scan[1], Scan[2], . . . , and Scan[n]) are supplied with scan signals from the scan driver 110, the data lines (Data[1], Data[2], . . . , and Data[m]) are supplied with data signals from the data driver 120, and the light emitting control lines (Em[1], Em[2], . . . , and Em[n]) are supplied with light emitting control signals from the light emitting control driver 130.

Figure 2:
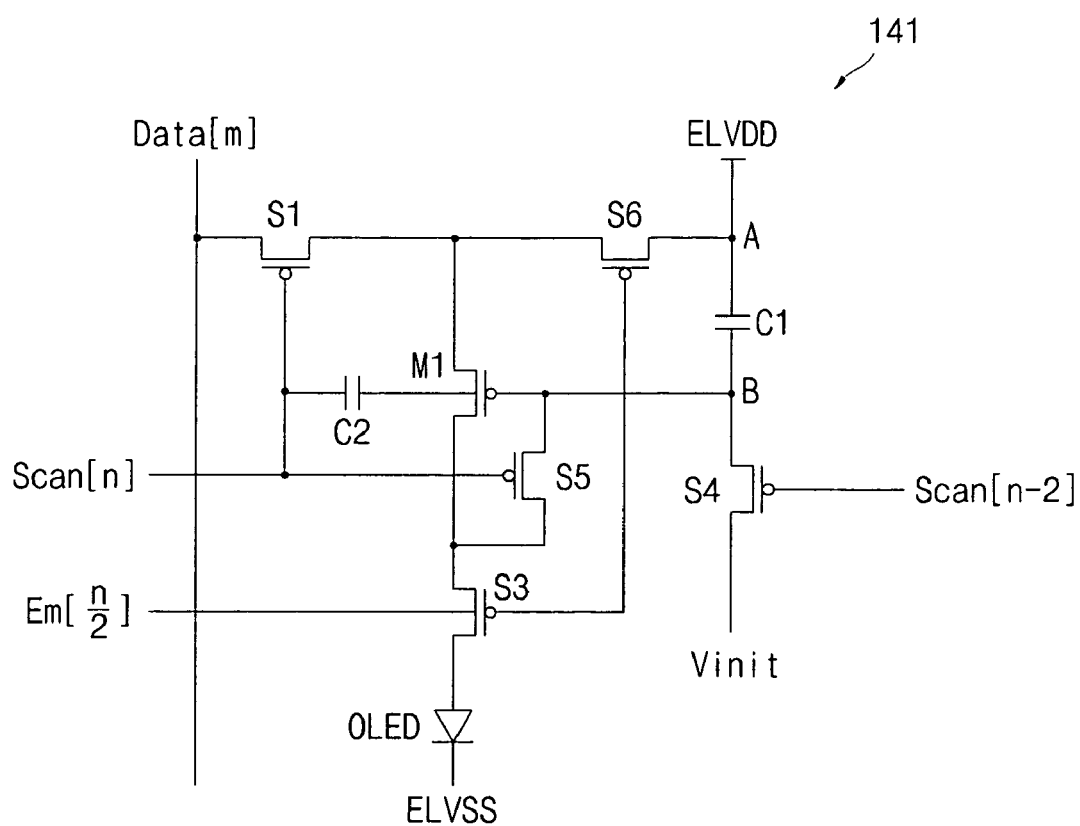
FIG. 2 is a circuit diagram illustrating a pixel circuit of an organic light emitting display according to an exemplary embodiment of the present invention.

FIG. 2 illustrates a circuit diagram of a pixel circuit of an organic light emitting display according to an exemplary embodiment of the present invention.

As illustrated in FIG. 2, a pixel circuit of an organic light emitting display according to one exemplary embodiment includes a scan line Scan[n], a second previous scan line Scan[n−2], a data line Data[m], a light emitting control line Em[n/2], a first power supply voltage line ELVDD, a second power supply voltage line ELVSS, a third power supply voltage line Vinit, a drive transistor M1, a first switching element S1, a second switching element S2, a third switching element S3, a fourth switching element S4, a fifth switching element S5, a first storage capacitor C1, a second storage capacitor C2 and an organic light emitting diode OLED.

The scan line Scan[n] supplies a scan signal, which selects an organic light emitting diode OLED to be emitted, to a control electrode of the first switching element S1. The scan line Scan[n] is electrically coupled to the scan driver 110 (see FIG. 1) that produces the scan signal.

The second previous scan line Scan[n−2] is denoted by "Scan[n−2]" in that it uses a previously selected n−2$^{th}$ scan line in common. In other words, the second previous scan line Scan[n−2] is denoted by "Scan[n−2]" in that it uses a previous odd-numbered scan line in common in case of an odd-numbered scan line, and a precious even-numbered scan line in common in case of an even-numbered scan line. The second previous scan line Scan[n−2] applied to a control electrode of the fourth switching element S4 can apply the third power supply voltage Vinit to the first storage capacitor C1 and the second storage capacitor C2 and can initialize a voltage stored in the first storage capacitor C1 and the second storage capacitor C2.

The data line Data[m] can supply a data signal (a voltage) that is proportional to a light emission brightness to a first electrode A of the first storage capacitor C1 and/or a first electrode of the drive transistor M1. The data line Data[m] is electrically coupled to the data driver 120 (see FIG. 1) that produces the data signal.

The light emitting control line Em[n/2] is electrically coupled to a control electrode of the third switching element S3 and can control the third switching element S3 to control a light emission time of the organic light emitting diode OLED. The light emitting control line Em[n/2] is electrically coupled to the light emitting control driver 130 (see FIG. 1) that produces a light emitting control signal.

The first power supply voltage line ELVDD allows the first power supply voltage to be supplied to the organic light emitting diode OLED.

The second power supply voltage line ELVSS allows the second power supply voltage to be supplied to the organic light emitting diode OLED. In one exemplary embodiment, the first power supply voltage is higher than the second power supply voltage.

The third power supply voltage line Vinit allows the third power supply voltage to be applied to the first storage capacitor C1 and the second storage capacitor C2 and initialize a voltage stored in the first storage capacitor C1 and the second storage capacitor C2.

A first electrode (a drain electrode or a source electrode) of the first switching element S1 is electrically coupled to the data line Data[m], and a second electrode (a source electrode or a drain electrode) is electrically coupled to a first electrode of the drive transistor M1, and a control electrode (a gate electrode) is electrically coupled to the scan line Scan[n]. When the first switching element S1 is turned on, it can apply a data signal to the first electrode A of the first storage capacitor C1 and/or the first electrode of the drive transistor M1.

A first electrode of the second switching element S2 is electrically coupled with the first switching element S1 and the drive transistor M1, and a second electrode is electrically coupled to the first power supply voltage line ELVDD and the first electrode of the first storage capacitor C1, and a control electrode is electrically coupled to the light emitting control line Em[n/2]. When a scan signal of a low level is applied to the control electrode of the second switching element S2, the second switching element S2 is turned on to apply the first power supply voltage $V_{DD}$ to the drive transistor M1.

A first electrode of the third switching element S3 is electrically coupled to the drive transistor M1 and the fifth switching element S5, and a second electrode is electrically coupled to an anode of the organic light emitting diode OLED, and a control electrode is electrically coupled to the light emitting control line Em[n/2]. When a light emitting control signal of a low level is applied to the control electrode of the third switching element S3, the third switching element is turned on, such that a drive current of the drive transistor M1 flows to the organic light emitting diode OLED.

A first electrode of the fourth switching element S4 is electrically coupled to the control electrode of the drive transistor M1 and a second electrode B of the first storage capacitor C1, and a second electrode is electrically coupled to the third power supply voltage line Vinit, and a control electrode is electrically coupled to the second previous scan line Scan[n−2]. If a scan signal of a low level is applied to the control electrode of the fourth switching element S4, the fourth switching element is turned on and initializes a voltage stored in the first storage capacitor C1 and the second storage capacitor C2.

A first electrode of the fifth switching element S5 is electrically coupled to the control electrode of the drive transistor M1 and the first storage capacitor C1, and a second electrode is electrically coupled to the drive transistor M1 and the third switching element S3, and a control electrode is electrically coupled to the scan line Scan[n]. If a scan signal of a low level is applied to the control electrode of the fifth switching element S5, the fifth switching element is turned on and diode-connects the drive transistor M1.

A first electrode of the first storage capacitor C1 is electrically coupled to the first power supply voltage line ELVDD and the second switching element S2, and a second electrode is electrically coupled to the drive transistor M1 and the fourth switching element S4. The first storage capacitor C1 can store a voltage difference between the first electrode A and the second electrode B.

A first electrode of the second storage capacitor C2 is electrically coupled to the scan line Scan[n] and the control electrode of the first switching element S1, and a second electrode of the second storage capacitor C2 is electrically coupled to the control electrode of the drive transistor M1. The first power supply voltage for driving a pixel circuit should be lower than or equal to the maximum gradation voltage of a data voltage. If a data voltage is the maximum gradation voltage (black voltage), the first power supply voltage $V_{DD}$ of the first power supply voltage line ELVDD should be below, for example, a predetermined voltage. Here, because a drive voltage of the organic light emitting diode OLED should be maintained constantly, the second power supply voltage of the second power supply voltage line ELVSS is lowered. That is, because the maximum gradation voltage (black voltage) of a data voltage is in the neighborhood of 5V, the first power supply voltage should not be beyond 5V. Hence, the second power supply voltage should have a negative voltage of −6V so as to maintain a voltage difference of 11V between the first power supply voltage and the second power supply voltage. In this case, the efficiency of a DC/DC converter that supplies the first power supply voltage and the second power supply voltage is relatively lowered, and thus the total efficiency of a pixel circuit is lowered. In order to increase the efficiency of a DC/DC converter, the first power supply voltage and the second power supply voltage should have a positive voltage range.

In order to compensate this, the second storage capacitor C2 is used. The second storage capacitor C2 can increase a voltage of the control electrode of the drive transistor. Here, a voltage of the control electrode can be expressed by the sum of a data voltage and a threshold voltage.

A first electrode of the drive transistor M1 is electrically coupled to the first switching element S1 and the second switching element S2, and a second electrode is electrically coupled to the fifth switching element S5 and the third switching element S3, and a control electrode is electrically coupled to the first storage capacitor C1, the fourth switching element S4, and the fifth switching element S5. The drive transistor M1 in the described embodiment supplies an amount of current (e.g., a certain amount of current), which is produced by the first power supply voltage applied from the first power supply voltage line ELVDD and the data voltage applied from the data line Data[m], to the organic light emitting diode OLED.

An anode of the organic light emitting diode OLED is electrically coupled to the second electrode of the third switching element S3, and a cathode of the organic light emitting diode OLED is electrically coupled to the second power supply voltage line ELVSS. A current applied from the drive transistor M1 is applied to the organic light emitting diode OLED through the third switching element S3, so that the organic light emitting diode OLED emits light (e.g., with a predetermined brightness).

Figure 3:
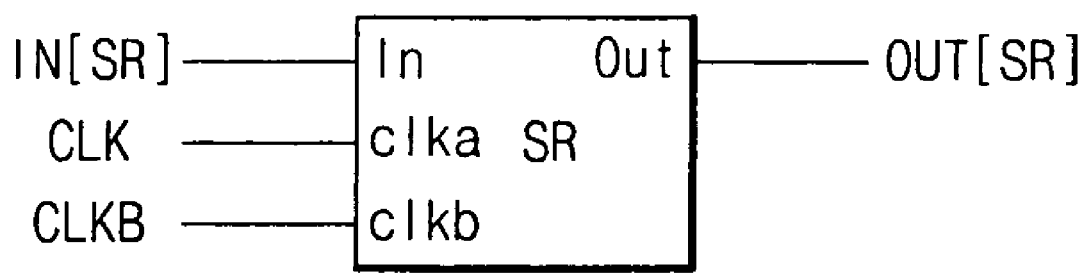
FIG. 3 is a block diagram illustrating a shift register in a light emitting control driver and a scan driver of an organic light emitting display according to an exemplary embodiment of the present invention.

FIG. 3 is a block diagram illustrating a shift register in a light emitting control driver and a scan driver of an organic light emitting display according to an exemplary embodiment of the present invention.

As shown in FIG. 3, the shift register SR is supplied with a shift register input signal IN[SR], a clock signal CLK, a negative clock signal CLKB and outputs a shift register output signal OUT[SR] in which the shift register input signal IN[SR] may be shifted in time. The shift register can output an output signal OUT[SR] that is the same as an input signal IN[SR] when a clock signal CLK of a low level and a negative clock signal CLKB of a high level are applied and outputs an output signal OUT[SR] that is the same as a previous output signal when an output signal OUT[SR] of a high level and a negative clock signal CLKB of a low level are applied. Here, the previous output signal means an output signal that is outputted when a clock signal CLK of a low level and a negative clock signal CLKB of a high level are applied immediately before an output signal OUT[SR] of a high level and a negative clock signal CLKB of a low level are applied.

Figure 4:
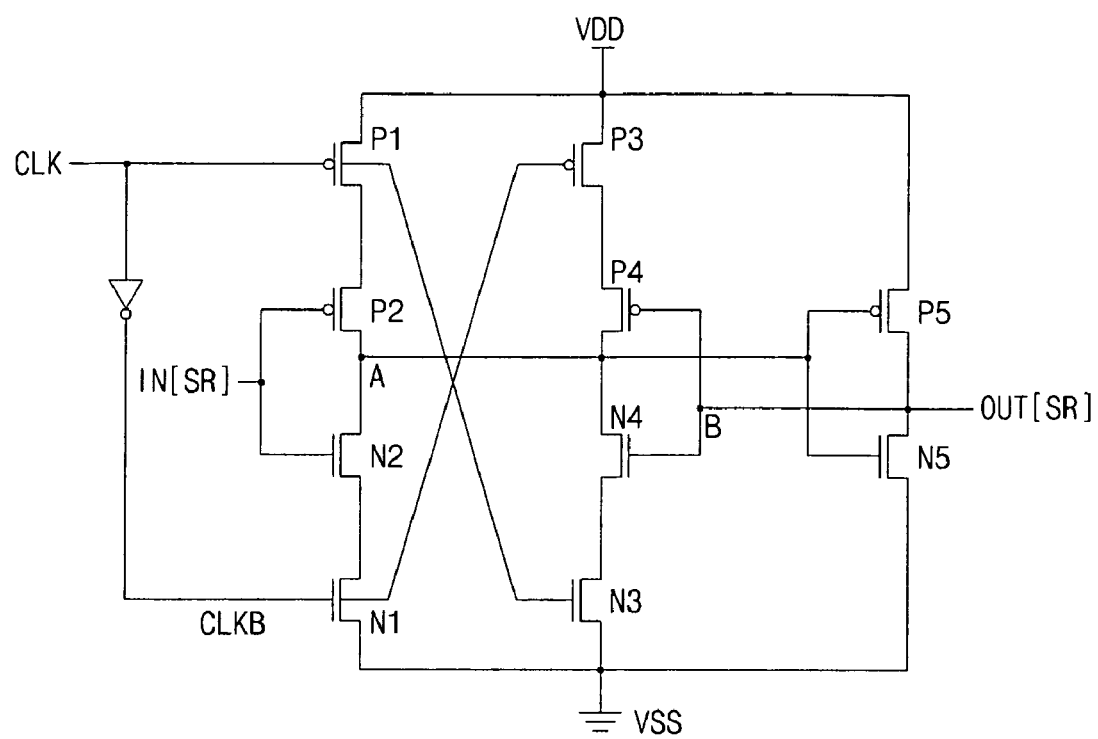
FIG. 4 is a circuit diagram illustrating the shift register of FIG. 3.

FIG. 4 is a circuit diagram illustrating the shift register of FIG. 3.

As described in reference to FIG. 4, in the scan driver and the light emitting control driver of the organic light emitting display according to an exemplary embodiment of the present invention, the shift register receives the clock signal CLK, the negative clock signal CLKB, and the shift register input signal IN[SR]. The shift register includes a first power supply voltage line VDD, a second power supply voltage line VSS, a first PMOS switching element P1, a second PMOS switching element P2, a third PMOS switching element P3, a fourth PMOS switching element P4, a fifth PMOS switching element P5, a first NMOS switching element N1, a second NMOS switching element N2, a third NMOS switching element N3, a fourth NMOS switching element N4 and a fifth NMOS switching element N5.

The clock signal CLK is an opposite signal to the negative clock signal CLKB, such that when the clock signal CLK has a high level, the negative clock signal CLKB has a low level, and when the clock signal CLK has a low level, then the negative clock signal CLKB has a high level.

The first power supply voltage line VDD enables the first power supply voltage to be supplied to the shift register SR.

The second power supply voltage line VSS enables the second power supply voltage to be supplied to the shift register SR. In the described embodiment, the first power supply voltage has a higher level than the second power supply voltage.

A first electrode (a drain electrode or a source electrode) of the first PMOS switching element P1 is electrically coupled to the first power supply voltage VDD, and a second electrode (a drain electrode or a source electrode) is electrically coupled to the second PMOS switching element P2, and a control electrode (a gate electrode) is electrically coupled to the clock signal CLK. When a clock signal CLK of a low level is applied to the control electrode of the first PMOS switching element P1, then the first PMOS switching element is turned on to supply the first power supply voltage VDD to a first electrode of the second PMOS switching element P2.

A first electrode of the second PMOS switching element P2 is electrically coupled to the second electrode of the first PMOS switching element P1, a second electrode is electrically coupled to a first electrode of the second NMOS switching element N2, that is, a first node A', and a control electrode is electrically coupled to the shift register input signal IN[SR]. When a shift register input signal IN[SR] of a low level is applied to the control electrode of the second PMOS switching element P2, the second PMOS switching element P2 is turned on to supply the first power supply voltage VDD supplied from the first PMOS switching element P1 to the first node A'.

A first electrode of the third PMOS switching element P3 is electrically coupled to the first power supply voltage VDD, a second electrode is electrically coupled to the fourth PMOS switching element P4, and a control electrode is electrically coupled to the negative clock signal CLKB. When a negative clock signal CLKB of a low level is applied to the control electrode of the third PMOS switching element P3, the third PMOS switching element P3 is turned on to supply the first power supply voltage VDD to a first electrode of the fourth PMOS switching element P4.

A first electrode of the fourth PMOS switching element P4 is electrically coupled to the second electrode of the third PMOS switching element P3, a second electrode is electrically coupled to a first electrode of the fourth NMOS switching element N4, that is, the first node A', and a control electrode is electrically coupled to the shift register output signal OUT[SR] at a second node B'. When the shift register output signal OUT[SR] of a low level is applied to the control electrode of the fourth PMOS switching element P4, the fourth PMOS switching element is turned on to supply the first power supply voltage VDD supplied from the third PMOS switching element P3 to the first node A'.

A first electrode of the fifth PMOS switching element P5 is electrically coupled to the first power supply voltage VDD, a second electrode is electrically coupled to a first electrode of the fifth NMOS switching element N5, and a control electrode is electrically coupled to the first node A'. When a signal of a low level is applied to the control electrode of the fifth PMOS switching element P5 through the first node A, the fifth PMOS switching element is turned on to supply the first power supply voltage VDD to the shift register output signal OUT[SR].

A first electrode of the first NMOS switching element N1 is electrically coupled to the second NMOS switching element N2, a second electrode is electrically coupled to the second power supply voltage VSS, and a control electrode is electrically coupled to the negative clock signal CLKB. When a negative clock signal CLKB of a high level is applied to the control electrode of the first NMOS switching element N1, the first NMOS switching element N1 is turned on to supply the second power supply voltage VSS to a second electrode of the second NMOS switching element N2.

A first electrode of the second NMOS switching element N2 is electrically coupled to the second electrode of the second PMOS switching element P2, that is, the first node A', a second electrode is electrically coupled to the first electrode of the first NMOS switching element N1, and a control electrode is electrically coupled to the shift register input signal IN[SR]. When a shift register input signal IN[SR] of a high level is applied to the control electrode of the second NMOS switching element N2, the second NMOS switching element is turned on to supply the second power supply voltage VSS supplied from the first NMOS switching element N1 to the first node A'.

A first electrode of the third NMOS switching element N3 is electrically coupled to the fourth NMOS switching element N4, a second electrode is electrically coupled to the second power supply voltage VSS, and a control electrode is electrically coupled to the clock signal CLK. When a clock signal CLK of a high level is applied to the control electrode of the third NMOS switching element N3, the third NMOS switching element is turned on to supply the second power supply voltage VSS to a second electrode of the fourth NMOS switching element N4.

A first electrode of the fourth NMOS switching element N4 is electrically coupled to the second electrode of the fourth PMOS switching element P4, that is, the first node A', and a second electrode is electrically coupled to the first electrode of the third NMOS switching element N3, and a control electrode is electrically coupled to the shift register output signal OUT[SR]. When a shift register output signal OUT[SR] of a high level is applied to the control electrode of the fourth NMOS switching element N4, the fourth NMOS switching element is turned on to supply the second power supply voltage VSS supplied from the third NMOS switching element N3 to the first node A'.

A first electrode of the fifth NMOS switching element N5 is electrically coupled to the second electrode of the fifth PMOS switching element P5, a second electrode of the fifth NMOS switching element N5 is electrically coupled to the second power supply voltage VSS, and a control electrode of the fifth NMOS switching element N5 is electrically coupled to the first node A'. When a signal of a high level is applied to the control electrode of the fifth NMOS switching element N5 through the first node A', the fifth NMOS switching element is turned on to supply the second power supply voltage VSS to the shift register output signal OUT[SR].

Figure 5:
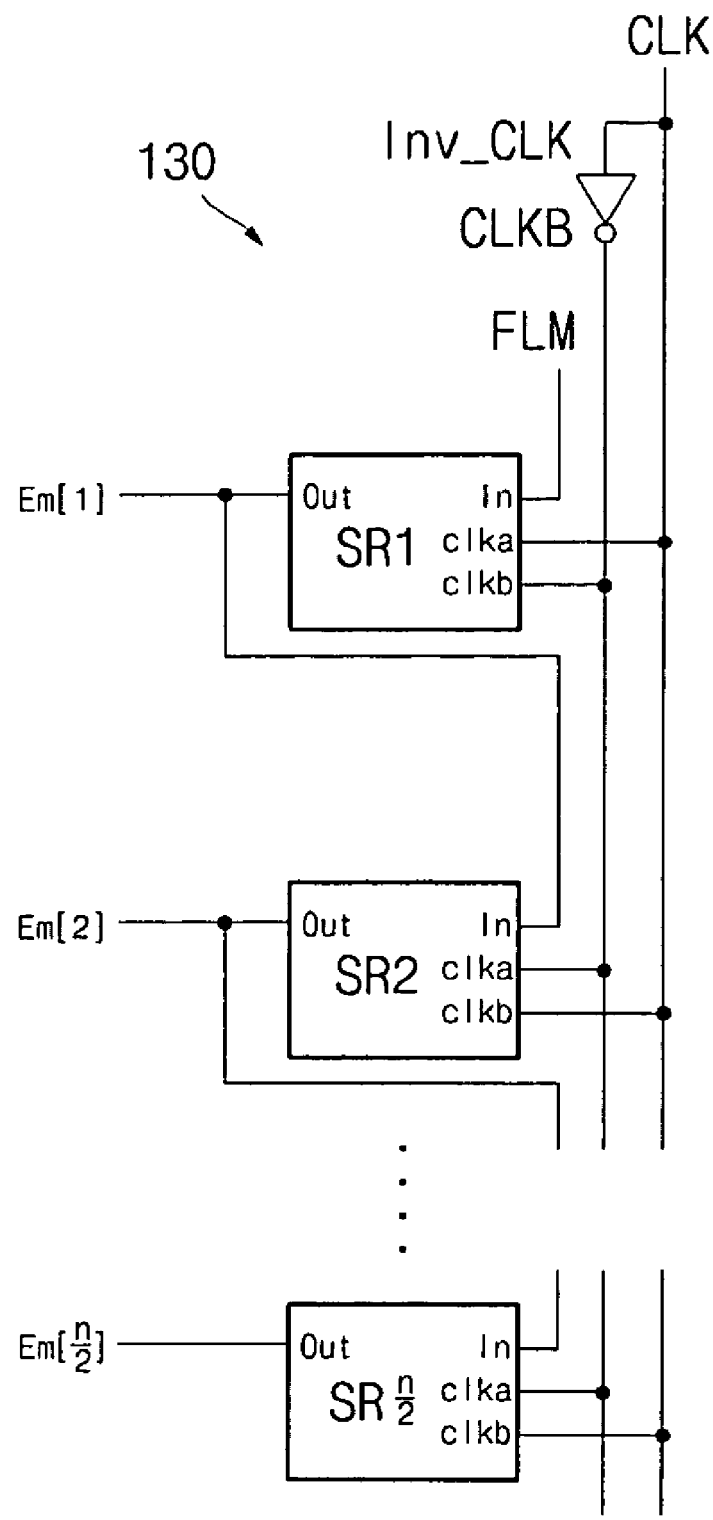
FIG. 5 is a block diagram illustrating a light emitting control driver of an organic light emitting display according to an exemplary embodiment of the present invention.

FIG. 5, is a block diagram illustrating a light emitting control driver of an organic light emitting display according to an exemplary embodiment of the present invention.

As shown in FIG. 5, a light emitting control driver of an organic light emitting display according to one embodiment includes a clock inverter Inv_CLK and first shift register SR1 to $n/2^{th}$ shift register SRn/2.

The clock inverter Inv_CLK is supplied with the clock signal CLK and produces the negative clock signal CLKB, so that the clock inverter can supply it to the first shift register SR1 to $n/2^{th}$ shift register SRn/2. Here, when the clock signal CLK is at a high level, then the negative clock signal CLKB is at a low level, and when the clock signal CLK is at a low level, then the negative clock signal CLKB is at a high level.

An input terminal In of the first shift register SR1 is electrically coupled to an initial drive line FLM, a first clock terminal clka is electrically coupled to a clock line CLK (e.g., a primitive or initial clock line), and a second clock terminal clkb is electrically coupled to a negative clock line CLKB (e.g., a primitive or initial negative clock line), so that the first shift register SR1 can output its output signal to an output terminal Out. The output signal of the first shift register SR1 is a signal produced by shifting an initial drive signal and becomes a first light emitting control signal that is outputted to the first light emitting control line Em[1]. The first light emitting control signal that is an output signal of the first shift register SR1 is an input signal of the second shift register SR2.

An input terminal In of the second shift register SR2 is electrically coupled to the first light emitting control line Em[1], a first clock terminal clka is electrically coupled to the negative clock line CLKB, and a second clock terminal clkb is electrically coupled to the clock line CLK, so that the second shift register SR2 can output its output signal to an output terminal Out. The output signal of the second shift register SR2 is a signal produced by shifting the first light emitting control signal and becomes a second light emitting control signal that is outputted to the second light emitting control line Em[2]. The second light emitting control signal that is an output signal of the second shift register SR2 is an input signal of the third shift register SR3.

Similarly to the first shift register SR1, a first clock terminal clka of an odd-numbered shift register among the third shift register SR3 to the $n/2^{th}$ shift register SRn/2 is electrically coupled to the clock line CLK, and a second clock terminal clkb of the odd-numbered shift register is electrically coupled to the negative clock line CLKB, so that the odd-numbered shift register can output its output signal to an output terminal Out. And, similarly to the second shift register SR2, a first clock terminal clka of an even-numbered shift register among the third shift register SR3 to the $n/2^{th}$ shift register SRn/2 is electrically coupled to the negative clock line CLKB, and a second clock terminal clkb of the even-numbered shift register is electrically coupled to the clock line CLK, so that the even-numbered shift register can output its output signal to an output terminal Out. Here, a light emitting control signal that is outputted to an output terminal Out of a previous shift register is applied to an input terminal of a shift register. In other words, the second light emitting control signal to the $n/2-1^{th}$ light emitting control signal that are outputted to output terminals Out of the second shift register SR2 to the $n/2-1^{th}$ shift register SRn/2-1 are applied to input terminals In of the third shift register SR3 to the $n/2^{th}$ shift register SRn/2, respectively.

The first light emitting control line Em[1] to the $n/2^{th}$ light emitting control line Em[n/2] are electrically coupled to the organic light emitting display panel 140 (see FIG. 1) and apply light emitting control signals to the organic light emitting display panel 140 (see FIG. 1).

Figure 6:
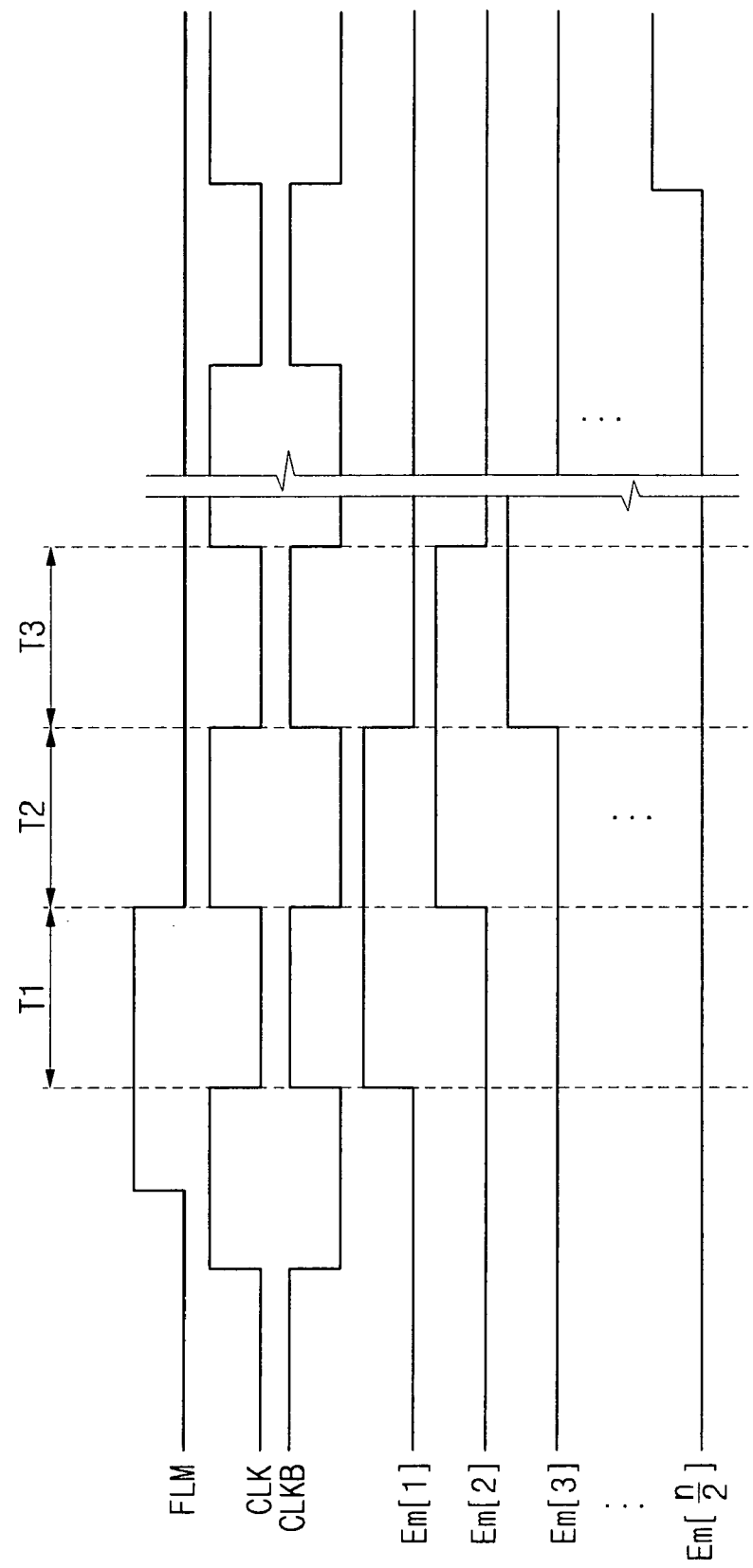
FIG. 6 is a timing diagram illustrating signals of the light emitting control driver of FIG. 5.

FIG. 6 is a timing diagram illustrating signals of the light emitting control driver of FIG. 5.

As shown in FIG. 6, a timing diagram of the light emitting control driver according to one exemplary embodiment includes a first drive period T1, a second drive period T2 and a third drive period T3. Here, the shift register outputs a signal that is the same as a signal applied to the input terminal when a clock signal of a low level is applied to the first clock terminal clka and a clock signal of a high level is applied to the second clock terminal clkb, and outputs a signal that is the same as a signal outputted to the output terminal in a previous period when a clock signal of a high level is applied to the first clock terminal clka and a clock signal of a low level is applied to the second clock terminal clkb. The first shift register SR1 to the $n/2^{th}$ shift register SRn/2 can sequentially output the first light emitting control signal of a high level to the $n/2^{th}$ light emitting control signal using an input signal applied from the first drive period T1 to the third drive period T3 and a previous shift register, an output signal of a previous drive period, a clock signal and a negative clock signal.

In the first drive period T1, an initial drive signal of a high level from the initial drive line FLM, a clock signal (e.g., a primitive or initial clock signal) of a low level from the clock line (e.g., the primitive or initial clock line) CLK and a negative clock signal (e.g., a primitive or initial negative clock signal) of a high level from the negative clock line (e.g., the primitive or initial negative clock line) CLKB are applied.

First, in the first shift register SR1, an initial drive signal of a high level is applied to the input terminal, and a clock signal of a low level is applied to the first clock terminal clka, and a negative clock signal of a high level is applied to the second clock terminal clkb, so that the output terminal can output a first light emitting control signal of a high level that is the same as an initial drive signal of a high level applied to the input terminal.

In the second shift register SR2, a first light emitting control signal of a high level is applied to the input terminal, and a negative clock signal of a high level is applied to the first clock terminal clka, and a clock signal of a low level is applied to the second clock terminal clkb, so that the output terminal can output a second light emitting control signal of a low level that is the same as an output signal in a previous drive period.

In the third shift register SR3, a second light emitting control signal of a low level is applied to the input terminal, and a clock signal of a low level is applied to the first clock terminal clka, and a negative clock signal of a high level is applied to the second clock terminal clkb, so that the output terminal can output a third light emitting control signal of a low level that is the same as the second light emitting control signal of a low level applied to the input terminal.

Finally, an even-numbered register of the fourth shift register SR4 to the $n/2^{th}$ shift register SRn/2 can operate in substantially the same manner as the second shift register SR2 and output a light emission signal of a low level, and an odd-numbered register of the fourth shift register SR4 to the $n/2^{th}$ shift register SRn/2 can operate in substantially the same manner as the third shift register SR3 and output a light emission signal of a low level.

In the second drive period T2, an initial drive signal of a low level from the initial drive line FLM, a clock signal of a high level from the clock line CLK and a negative clock signal of a low level from the negative clock line CLKB are applied.

First, in the first shift register SR1, an initial drive signal of a low level is applied to the input terminal, a clock signal of a high level is applied to the first clock terminal clka, and a negative clock signal of a low level is applied to the second clock terminal clkb, so that the output terminal can output a first light emitting control signal of a high level that is the same as the output signal in the first drive period T1.

In the second shift register SR2, a first light emitting control signal of a high level is applied to the input terminal, a negative clock signal of a low level is applied to the first clock terminal clka, and a clock signal of a high level is applied to the second clock terminal clkb, so that the output terminal can output a second light emitting control signal of a high level that is the same as the first light emitting control signal of a high level applied to the input terminal.

In the third shift register SR3, a second light emitting control signal of a high level is applied to the input terminal, a clock signal of a high level is applied to the first clock terminal clka, and a negative clock signal of a low level is applied to the second clock terminal clkb, so that the output terminal can output a third light emitting control signal of a low level that is the same as the output signal in the first drive period T1.

In the fourth shift register SR4, a third light emitting control signal of a low level is applied to the input terminal, a negative clock signal of a low level is applied to the first clock terminal clka, and a clock signal of a high level is applied to the second clock terminal clkb, so that the output terminal can output a fourth light emitting control signal of a low level that is the same as the third light emitting control signal of a low level applied to the input terminal.

Finally, an odd-numbered register of the fifth shift register SR5 to the $n/2^{th}$ shift register SRn/2 can operate in substantially the same manner as the third shift register SR3 and output a light emission signal of a low level, and an even-numbered register of the fifth shift register SR5 to the $n/2^{th}$ shift register SRn/2 can operate in substantially the same manner as the fourth shift register SR4 and output a light emission signal of a low level.

In the third drive period T3, an initial drive signal of a low level from the initial drive line FLM, a clock signal of a low level from the clock line CLK, and a negative clock signal of a high level from the negative clock line CLKB are applied.

First, in the first shift register SR1, an initial drive signal of a low level is applied to the input terminal, a clock signal of a low level is applied to the first clock terminal clka, and a negative clock signal of a high level is applied to the second clock terminal clkb, so that the output terminal can output a first light emitting control signal of a low level that is the same as the initial drive signal of a low level applied to the input terminal.

In the second shift register SR2, a first light emitting control signal of a low level is applied to the input terminal, a negative clock signal of a high level is applied to the first clock terminal clka, and a clock signal of a low level is applied to the second clock terminal clkb, so that the output terminal can output a second light emitting control signal of a high level that is the same as the output signal in the second drive period T2.

In the third shift register SR3, a second light emitting control signal of a high level is applied to the input terminal, a clock signal of a low level is applied to the first clock terminal clka, and a negative clock signal of a high level is applied to the second clock terminal clkb, so that the output terminal can output a third light emitting control signal of a high level that is the same as the second light emitting control signal of a high level applied to the input terminal.

In the fourth shift register SR4, a third light emitting control signal of a high level is applied to the input terminal, a negative clock signal of a high level is applied to the first clock terminal clka, and a clock signal of a low level is applied to the second clock terminal clkb, so that the output terminal can output a fourth light emitting control signal of a low level that is the same as the output signal in the second drive period T2.

In the fifth shift register SR5, a fourth light emitting control signal of a low level is applied to the input terminal, a clock signal of a low level is applied to the first clock terminal clka, and a negative clock signal of a high level is applied to the second clock terminal clkb, so that the output terminal can output a fifth light emitting control signal of a low level that is the same as the fourth light emitting control signal of a low level applied to the input terminal.

Finally, an even-numbered register of the sixth shift register SR6 to the $n/2^{th}$ shift register SRn/2 can operate in substantially the same manner as the fourth shift register SR4 and can output a light emission signal of a low level, and an odd-numbered register of the sixth shift register SR6 to the $n/2^{th}$ shift register SRn/2 can operate in substantially the same manner as the fifth shift register SR5 and can output a light emission signal of a low level.

The first shift register SR1 to the $n/2^{th}$ shift register SRn/2 sequentially output the first light emitting control signal to the $n/2^{th}$ light emitting control signal of a high level by an input signal applied from the first drive period T1 to the third drive period T3 and a previous shift register and an output signal of a previous drive period.

Figure 7:
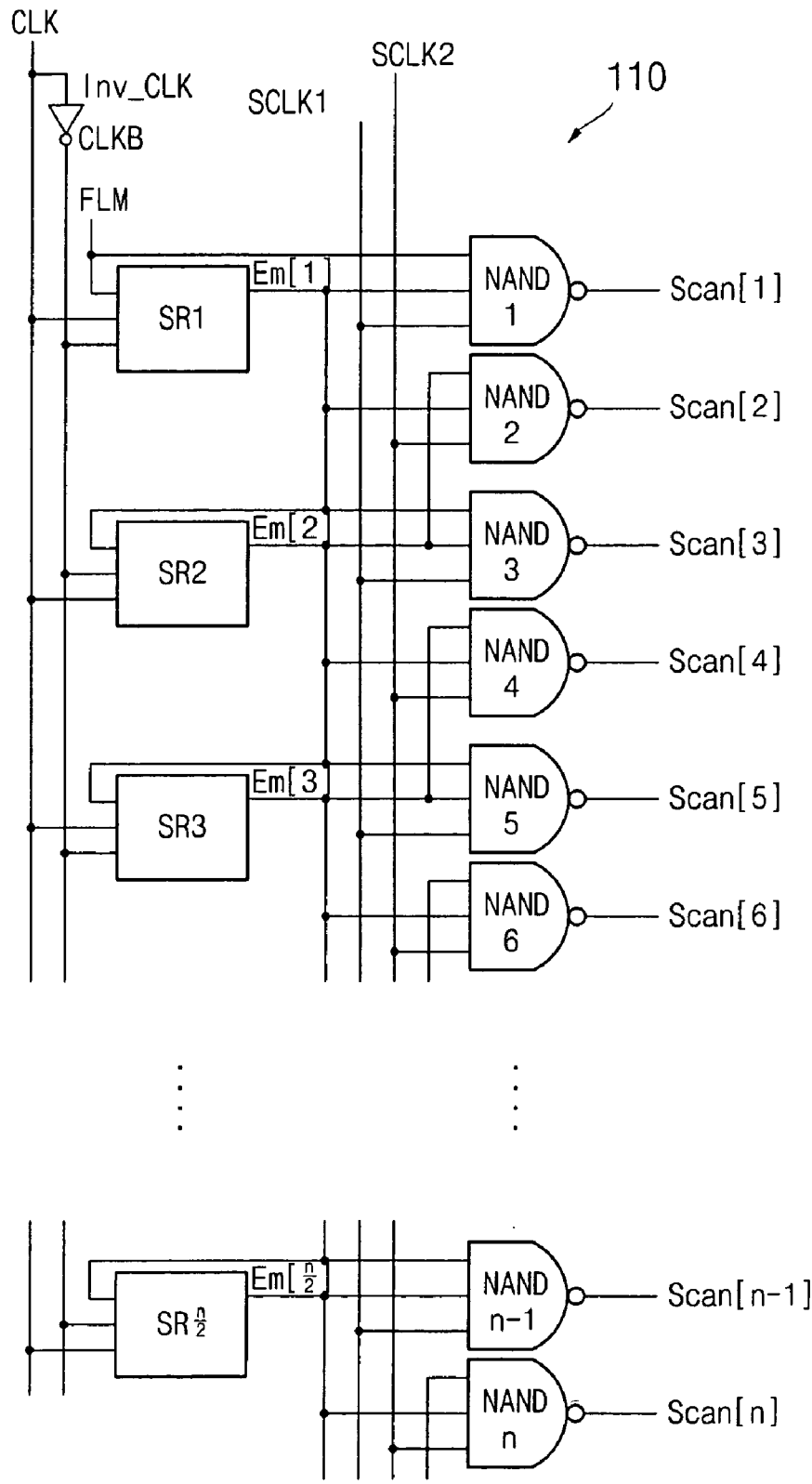
FIG. 7 is a block diagram illustrating a scan driver of an organic light emitting display according to an exemplary embodiment of the present invention.

FIG. 7 is a block diagram illustrating a scan driver of an organic light emitting display according to an exemplary embodiment of the present invention.

As shown in FIG. 7, a scan driver of an organic light emitting display according to one exemplary embodiment includes the clock inverter Inv_CLK, the first shift register SR1 to the $n/2^{th}$ shift register SRn/2 and a first NAND gate NAND1 to an $n^{th}$ NAND gate NANDn. The first shift register SR1 to the $n/2^{th}$ shift register SRn/2 are the same as the first shift register SR1 to the $n/2^{th}$ shift register SRn/2 of the light emitting control driver illustrated in FIG. 5. Hence, output signals of the first shift register SR1 to the $n/2^{th}$ shift register SRn/2 are the first light emitting control signal to the $n/2^{th}$ light emitting control signal n/2. The clock inverter Inv_CLK is also the same as the clock inverter Inv_CLK illustrated in FIG. 5.

The clock inverter Inv_CLK is supplied with the clock signal CLK and produces the negative clock signal CLKB, so that the clock inverter can supply it to the first shift register SR1 to the $n/2^{th}$ shift register SRn/2. When the clock signal CLK is at a high level, then the negative clock signal CLKB is at a low level, and when the clock signal CLK is at a low level, then the negative clock signal CLKB is at a high level.

An input terminal In of the first shift register SR1 is electrically coupled to an initial drive line FLM, a first clock terminal clka of the first shift register SR1 is electrically coupled to a clock line CLK, and a second clock terminal clkb is electrically coupled to a negative clock line CLKB, so that the first shift register SR1 can output its output signal to an output terminal Out. The output signal of the first shift register SR1 is a signal produced by shifting an initial drive signal and becomes a first light emitting control signal that is outputted to the first light emitting control line Em[1]. The first light emitting control signal that is an output signal of the first shift register SR1 is an input signal of the second shift register SR2.

The first NAND gate NAND1 is electrically coupled to an initial drive line FLM, a first clock line SLCK1 and a first light emitting control line Em[1] and is supplied with an initial drive signal, a first clock signal and a first light emitting control signal, so that the first NAND gate can output a first scan signal to a first scan line.

An input terminal In of the second shift register SR2 is electrically coupled to the first light emitting control line Em[1], a first clock terminal clka is electrically coupled to a negative clock line CLKB, and a second clock terminal clkb is electrically coupled to a clock line CLK, so that the second shift register SR2 can output its output signal to an output terminal Out. The output signal of the second shift register SR2 is a signal produced by shifting the first light emitting control signal and becomes a second light emitting control signal that is outputted to the second light emitting control line Em[2]. The second light emitting control signal that is an output signal of the second shift register SR2 is an input signal of the third shift register SR3.

The second NAND gate NAND2 is electrically coupled to the first light emitting control line Em[1], the second clock line SLCK2 and the second light emitting control line Em[2], and is supplied with the first light emitting control signal, the second clock signal, and the second light emitting control signal, so that the second NAND gate can output a second scan signal to a second scan line.

The third NAND gate NAND3 is electrically coupled to the first light emitting control line Em[1], the first clock line SLCK1 and the second light emitting control line Em[2], and is supplied with the first light emitting control signal, the first clock signal, and the second light emitting control signal, so that the third NAND gate can output a third scan signal to a third scan line.

The fourth NAND gate NAND4 is electrically coupled to the second light emitting control line Em[2], the second clock line SLCK2 and the third light emitting control line Em[3], and is supplied with the second light emitting control signal, the second clock signal, and the third light emitting control signal, so that the fourth NAND gate can output a fourth scan signal to a fourth scan line.

An odd-numbered NAND gate of the fifth NAND gate NAND5 to the $n^{th}$ NAND gate NANDn is electrically coupled with the first clock line SCLK1 and two light emitting control lines in substantially the same manner as the third NAND gate NAND3 and can output a scan signal to a respective scan line. Here, if an odd-numbered NAND gate is $a^{th}$ NAND gate, then the two light emitting control lines are $(a-1)/2^{th}$ light emitting control line Em[(a−1)/2] and $(n+1)/2^{th}$ light emitting control line Em[(n+1)/2]. And, an even-numbered NAND gate of the fifth NAND gate NAND5 to the $n^{th}$ NAND gate NANDn is electrically coupled with the second clock line SCLK2 and two light emitting control lines in substantially the same manner as the fourth NAND gate NAND4 and can output a scan signal to a respective scan line. Here, if an even-numbered NAND gate is $b^{th}$ NAND gate, then the two light emitting control lines are $b/2^{th}$ light emitting control line Em[b/2] and $(b/2)+1^{th}$ light emitting control line Em[(b/2)+1].

The first scan line Scan[1] to the $n^{th}$ scan line Scan[n] are electrically coupled to the organic light emitting display panel 140 (see FIG. 1) and can apply a scan signal to the organic light emitting display panel 140 (see FIG. 1).

Similarly to the first shift register SR1, a first clock terminal clka of an odd-numbered shift register among the third shift register SR3 to the $n/2^{th}$ shift register SRn/2 is electrically coupled to the clock line CLK, and a second clock terminal clkb of the odd-numbered shift register is electrically coupled to the negative clock line CLKB, so that the odd-numbered shift register can output its output signal to an output terminal Out. And, similarly to the second shift register SR2, a first clock terminal clka of an even-numbered shift register among the third shift register SR3 to the $n/2^{th}$ shift register SRn/2 is electrically coupled to the negative clock line CLKB, and a second clock terminal clkb of the even-numbered shift register is electrically coupled to the clock line CLK, so that the even-numbered shift register can output its output signal to an output terminal Out. Here, a light emitting control signal that is outputted to an output terminal Out of a previous shift register is applied to an input terminal of a shift register. This way, the second light emitting control signal to the $n/2-1^{th}$ light emitting control signal that are outputted to output terminals Out of the second shift register SR2 to the $n/2-1^{th}$ shift register SRn/2−1 are applied to input terminals In of the third shift register SR3 to the $n/2^{th}$ shift register SRn/2, respectively.

The first light emitting control line Em[1] to the $n/2^{th}$ light emitting control line Em[n/2] are electrically coupled to the organic light emitting display panel 140 (see FIG. 1) and can apply a light emitting control signal to the organic light emitting display panel 140 (see FIG. 1).

Figure 8:
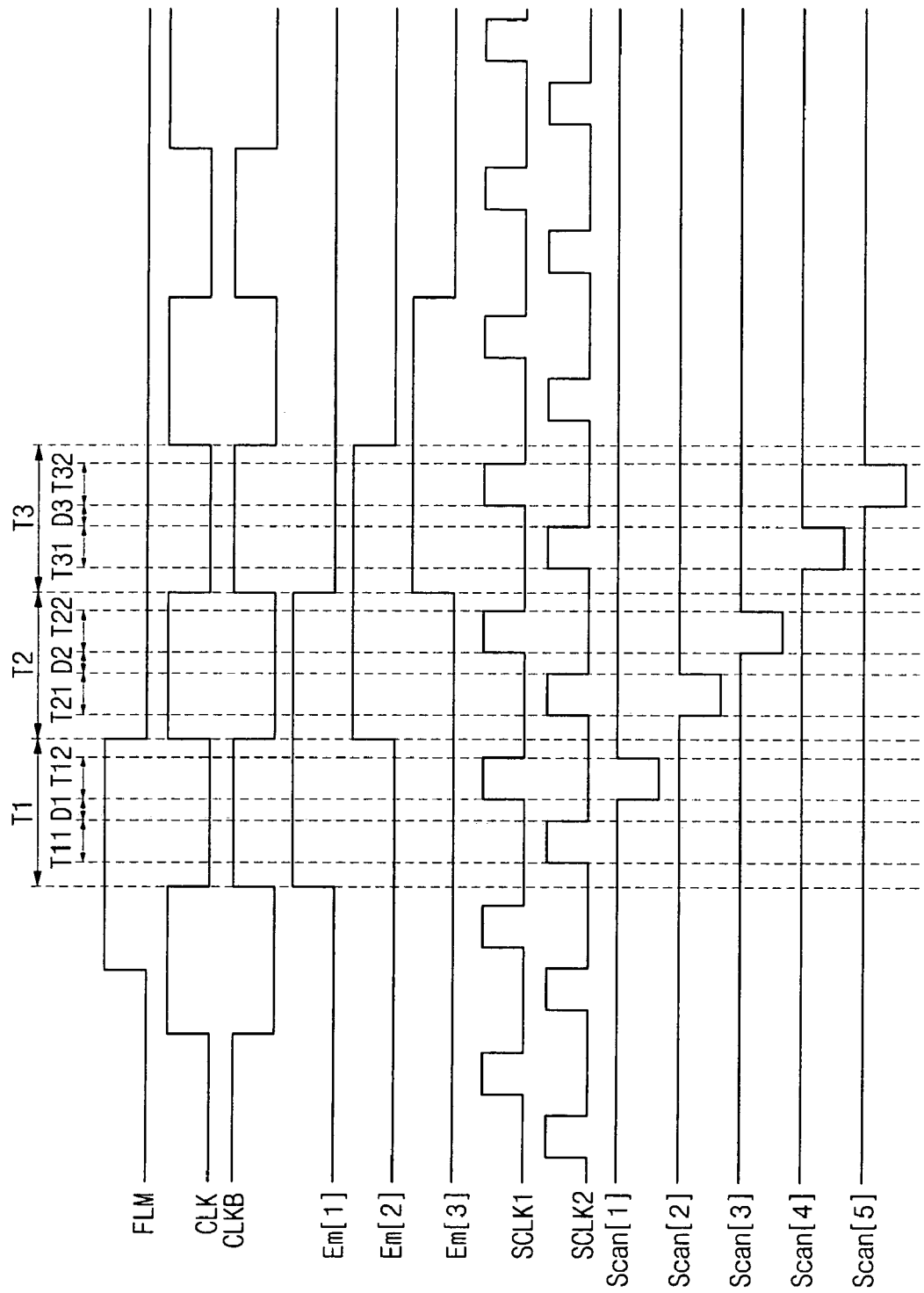
FIG. 8 is a timing diagram illustrating signals of the scan driver of FIG. 7.

FIG. 8 is a timing diagram of signals of the scan driver of FIG. 7.

As illustrated in FIG. 8, the timing diagram of the scan driver in one exemplary embodiment includes a first drive period T1, a second drive period T2 and a third drive period T3. The first drive period T1, the second drive period T2 and the third drive period T3 each include a first sub drive period, a delay period and a second sub drive period. The first sub drive period, the delay period and the second sub drive period represent sections (or periods) that output scan signals to the scan lines (Scan[1], Scan[2], . . . , and Scan[n]) by the first clock signal of the first clock line SLCK1, the second clock signal of the second clock line SLCK2, and light emitting control signals of the light emitting control lines (Em[1], Em[2], . . . , Em[n/2]) applied to the first NAND gate NAND1 to the $n^{th}$ NAND gate NANDn. The first clock signal and the second clock signal are signals that have inverted phases and are overlapped with their predetermined portions at a low level. This enables a predetermined time interval between the outputted scan signals and allows to secure a margin to clock skew or delay.

In the first drive period T1, an initial drive signal of a high level from the initial drive line FLM, a clock signal of a low level from the clock line CLK and a negative clock signal of a high level from the negative clock line CLKB are applied.

First, in the first shift register SR1, an initial drive signal of a high level is applied to the input terminal, a clock signal of a low level is applied to the first clock terminal clka, and a negative clock signal of a high level is applied to the second clock terminal clkb, so that the output terminal can output a first light emitting control signal of a high level that is the same as an initial drive signal of a high level applied to the input terminal.

In the second shift register SR2, a first light emitting control signal of a high level is applied to the input terminal, a negative clock signal of a high level is applied to the first clock terminal clka, and a clock signal of a low level is applied to the second clock terminal clkb, so that the output terminal can output a second light emitting control signal of a low level that is the same as an output signal in a previous drive period.

In the third shift register SR3, a second light emitting control signal of a low level is applied to the input terminal, a clock signal of a low level is applied to the first clock terminal clka, and a negative clock signal of a high level is applied to the second clock terminal clkb, so that the output terminal can output a third light emitting control signal of a low level that is the same as the second light emitting control signal of a low level applied to the input terminal.

Finally, an even-numbered register of the fourth shift register SR4 to the $n/2^{th}$ shift register SRn/2 can operate in substantially the same manner as the second shift register SR2 and can output a light emission signal of a low level, and an odd-numbered register of the fourth shift register SR4 to the $n/2^{th}$ shift register SRn/2 can operate in substantially the same manner as the third shift register SR3 and can output a light emission signal of a low level.

In the first sub drive period T11 of the first drive period T1, the first clock signal of a low level applied from the first clock line SCLK1 and the second clock signal of a high level applied from the second clock line SCLK2 are applied to the first NAND gate NAND1 to the $n^{th}$ NAND gate NANDn.

The first NAND gate NAND1 is supplied with the first clock signal of a low level, the initial drive signal of a high level, and the first light emitting control signal of a high level, and outputs a first scan signal of a high level to the first scan line Scan[1].

The second NAND gate NAND2 is supplied with the second clock signal of a high level, the first light emitting control signal of a high level, and the second light emitting control signal of a low level, and outputs a second scan signal of a high level to the second scan line Scan[2].

Finally, the third NAND gate NAND3 to the $n^{th}$ NAND gate NANDn can output the third scan signal to the $n^{th}$ scan signal because the second light emitting control line Em[2] to the $n/2^{th}$ light emitting control line Em[n/2] electrically coupled therewith apply light emitting control signals of a low level to the third NAND gate NAND3 to the $n^{th}$ NAND gate NANDn.

In the delay period D1 of the first drive period T1, the first clock signal of a low level applied from the first clock line SCLK1 and the second clock signal of a low level applied from the second clock line SCLK2 are applied to the first NAND gate NAND1 to the $n^{th}$ NAND gate NANDn. The first NAND gate NAND1 to the $n^{th}$ NAND gate NANDn can output the first scan signal to the $n^{th}$ scan signal because the first clock line SCLK1 and the second clock line SCLK2 electrically coupled therewith apply the first clock signal and the second clock signal of a low level to the first NAND gate NAND1 to the $n^{th}$ NAND gate NANDn.

In the second sub drive period T12 of the first drive period T1, the first clock signal of a high level applied from the first clock line SCLK1 and the second clock signal of a low level applied from the second clock line SCLK2 are applied to the first NAND gate NAND1 to the $n^{th}$ NAND gate NANDn.

First, the first NAND gate NAND1 is supplied with the first clock signal of a high level, the initial drive signal of a high level and the first light emitting control signal of a high level, and outputs a first scan signal of a low level to the first scan line Scan[1].

The second NAND gate NAND2 to the $n^{th}$ NAND gate NANDn output the second scan signal to the $n^{th}$ scan signal of a high level because the second light emitting control line Em[2] to the $n/2^{th}$ light emitting control line Em[n/2] electrically coupled therewith apply light emitting control signals of a low level to the second NAND gate NAND2 to the $n^{th}$ NAND gate NANDn.

In the second drive period T2, an initial drive signal of a low level from the initial drive line FLM, a clock signal of a high level from the clock line CLK and a negative clock signal of a low level from the negative clock line CLKB are applied.

First, in the first shift register SR1, an initial drive signal of a low level is applied to the input terminal, a clock signal of a high level is applied to the first clock terminal clka, and a negative clock signal of a low level is applied to the second clock terminal clkb, so that the output terminal can output a first light emitting control signal of a high level that is the same as an output signal in the first drive period T1.

In the second shift register SR2, a first light emitting control signal of a high level is applied to the input terminal, a negative clock signal of a low level is applied to the first clock terminal clka, and a clock signal of a high level is applied to the second clock terminal clkb, so that the output terminal can output a second light emitting control signal of a high level that is the same as the first light emitting control signal of a high level applied to the input terminal.

In the third shift register SR3, a second light emitting control signal of a high level is applied to the input terminal, a clock signal of a high level is applied to the first clock terminal clka, and a negative clock signal of a low level is applied to the second clock terminal clkb, so that the output terminal can output a third light emitting control signal of a low level that is the same as an output signal in the first drive period T1.

In the fourth shift register SR4, a third light emitting control signal of a low level is applied to the input terminal, a negative clock signal of a low level is applied to the first clock terminal clka, and a clock signal of a high level is applied to the second clock terminal clkb, so that the output terminal can output a fourth light emitting control signal of a low level that is the same as the third light emitting control signal of a low level applied to the input terminal.

Finally, an odd-numbered register of the fifth shift register SR5 to the $n/2^{th}$ shift register SRn/2 can operate in substantially the same manner as the third shift register SR3 and can output a light emission signal of a low level, and an even-numbered register of the fifth shift register SR5 to the $n/2^{th}$ shift register SRn/2 can operate in substantially the same manner as the fourth shift register SR4 and can output a light emission signal of a low level.

In the first sub drive period T21 of the second drive period T2, the first clock signal of a low level applied from the first clock line SCLK1 and the second clock signal of a high level applied from the second clock line SCLK2 are applied to the first NAND gate NAND1 to the $n^{th}$ NAND gate NANDn.

First, the first NAND gate NAND1 is supplied with the first clock signal of a low level, the initial drive signal of a low level, and the first light emitting control signal of a high level, and outputs a first scan signal of a high level to the first scan line Scan[1].

The second NAND gate NAND2 is supplied with the second clock signal of a high level, the first light emitting control signal of a high level, and the second light emitting control signal of a high level, and outputs a second scan signal of a low level to the second scan line Scan[2].

The third NAND gate NAND3 is supplied with the first clock signal of a low level, the first light emitting control signal of a high level, and the second light emitting control signal of a high level, and outputs a third scan signal of a high level to the third scan line Scan[3].

Finally, the fourth NAND gate NAND4 to the $n^{th}$ NAND gate NANDn can output the fourth scan signal to the $n^{th}$ scan signal of a high level because the third light emitting control line Em[3] to the $n/2^{th}$ light emitting control line Em[n/2] electrically coupled therewith apply light emitting control signals of a low level to the fourth NAND gate NAND4 to the $n^{th}$ NAND gate NANDn.

In the delay period D2 of the second drive period T2, the first clock signal of a low level applied from the first clock line SCLK1 and the second clock signal of a low level applied from the second clock line SCLK2 are applied to the first NAND gate NAND1 to the $n^{th}$ NAND gate NANDn. The first NAND gate NAND1 to the $n^{th}$ NAND gate NANDn can output scan signals of a high level because the first clock line SCLK1 and the second clock line SCLK2 electrically coupled therewith apply the first clock signal and the second clock signal of a low level to the first NAND gate NAND1 to the $n^{th}$ NAND gate NANDn.

In the second sub drive period T22 of the second drive period T2, the first clock signal of a high level applied from the first clock line SCLK1 and the second clock signal of a low level applied from the second clock line SCLK2 are applied to the first NAND gate NAND1 to the $n^{th}$ NAND gate NANDn.

First, the first NAND gate NAND1 is supplied with the first clock signal of a high level, the initial drive signal of a low level, and the first light emitting control signal of a high level, and outputs a first scan signal of a high level to the first scan line Scan[1].

The second NAND gate NAND2 is supplied with the second clock signal of a low level, the first light emitting control signal of a high level, and the second light emitting control signal of a high level, and outputs a second scan signal of a high level to the second scan line Scan[2].

The third NAND gate NAND3 is supplied with the first clock signal of a high level, the first light emitting control signal of a high level, and the second light emitting control signal of a high level, and outputs a third scan signal of a low level to the third scan line Scan[3].

Finally, the fourth NAND gate NAND4 to the $n^{th}$ NAND gate NANDn output the fourth scan signal to the $n^{th}$ scan signal of a high level because the third light emitting control line Em[3] to the $n/2^{th}$ light emitting control line Em[n/2] electrically coupled therewith apply light emitting control signals of a low level to the fourth NAND gate NAND4 to the $n^{th}$ NAND gate NANDn.

In the third drive period T3, an initial drive signal of a low level from the initial drive line FLM, a clock signal of a low level from the clock line CLK and a negative clock signal of a high level from the negative clock line CLKB are applied.

First, in the first shift register SR1, an initial drive signal of a low level is applied to the input terminal, a clock signal of a low level is applied to the first clock terminal clka, and a negative clock signal of a high level is applied to the second clock terminal clkb, so that the output terminal can output a first light emitting control signal of a low level that is the same as the initial drive signal of a low level applied to the input terminal.

In the second shift register SR2, a first light emitting control signal of a low level is applied to the input terminal, a negative clock signal of a high level is applied to the first clock terminal clka, and a clock signal of a low level is applied to the second clock terminal clkb, so that the output terminal can output a second light emitting control signal of a high level that is the same as an output signal in the second drive period T2.

In the third shift register SR3, a second light emitting control signal of a high level is applied to the input terminal, a clock signal of a low level is applied to the first clock terminal clka, and a negative clock signal of a high level is applied to the second clock terminal clkb, so that the output terminal can output a third light emitting control signal of a low level that is the same as the second light emitting control signal of a high level applied to the input terminal.

In the fourth shift register SR4, a third light emitting control signal of a high level is applied to the input terminal, a negative clock signal of a high level is applied to the first clock terminal clka, and a clock signal of a low level is applied to the second clock terminal clkb, so that the output terminal can output a fourth light emitting control signal of a low level that is the same as an output signal in the second drive period T2.

In the fifth shift register SR5, a fourth light emitting control signal of a low level is applied to the input terminal, a clock signal of a low level is applied to the first clock terminal clka, and a negative clock signal of a high level is applied to the second clock terminal clkb, so that the output terminal can output a fifth light emitting control signal of a low level that is the same as the fourth light emitting control signal of a low level applied to the input terminal.

Finally, an even-numbered register of the sixth shift register SR6 to the $n/2^{th}$ shift register SRn/2 can operate in substantially the same manner as the fourth shift register SR4 and can output a light emission signal of a low level, and an odd-numbered register of the sixth shift register SR6 to the $n/2^{th}$ shift register SRn/2 can operate in substantially the same manner as the fifth shift register SR5 and can output a light emission signal of a low level.

The first sub drive period T31 of the third drive period T3 applies the first clock signal of a low level applied from the first clock line SCLK1 and the second clock signal of a high level applied from the second clock line SCLK2 to the first NAND gate NAND1 to the $n^{th}$ NAND gate NANDn.

First, the first NAND gate NAND1 to the third NAND gate NAND3 output the first scan signal to the third scan signal of a high level because the initial drive line FLM and the first light emitting control line Em[1] electrically coupled therewith apply the initial drive signal and the first light emitting control signal of a low level to the first NAND gate NAND1 to the third NAND gate NAND3.

The fourth NAND gate NAND4 is supplied with the second clock signal of a high level, the second light emitting control signal of a high level and the third light emitting control signal of a high level, and outputs a fourth scan signal of a low level to the fourth scan line Scan[4].

The fifth NAND gate NAND5 is supplied with the first clock signal of a low level, the second light emitting control signal of a high level and the third light emitting control signal of a high level, and outputs a fifth scan signal of a high level to the fifth scan line Scan[5].

Finally, the sixth NAND gate NAND6 to the $n^{th}$ NAND gate NANDn output the sixth scan signal to the $n^{th}$ scan signal of a high level because the fourth light emitting control line Em[4] to the $n/2^{th}$ light emitting control line Em[n/2] electrically coupled therewith apply light emitting control signals of a low level to the sixth NAND gate NAND6 to the $n^{th}$ NAND gate NANDn.

The delay period D3 of the third drive period T3 applies the first clock signal of a low level applied from the first clock line SCLK1 and the second clock signal of a low level applied from the second clock line SCLK2 to the first NAND gate NAND1 to the $n^{th}$ NAND gate NANDn. The first NAND gate NAND1 to the $n^{th}$ NAND gate NANDn output scan signals of a high level because the first clock line SCLK1 and the second clock line SCLK2 electrically coupled therewith apply the first clock signal and the second clock signal of a low level to the first NAND gate NAND1 to the $n^{th}$ NAND gate NANDn.

The second sub drive period T32 of the third drive period T3 applies the first clock signal of a high level applied from the first clock line SCLK1 and the second clock signal of a low level applied from the second clock line SCLK2 to the first NAND gate NAND1 to the $n^{th}$ NAND gate NANDn.

First, the first NAND gate NAND1 to the third NAND gate NAND3 output the first scan signal to the third scan signal of a high level because the initial drive line FLM and the first light emitting control line Em[1] electrically coupled therewith apply the initial drive signal and the first light emitting control signal of a low level to the first NAND gate NAND1 to the third NAND gate NAND3.

The fourth NAND gate NAND4 is supplied with the second clock signal of a low level, the second light emitting control signal of a high level and the third light emitting control signal of a high level and outputs a fourth scan signal of a high level to the fourth scan line Scan[4].

The fifth NAND gate NAND5 is supplied with the first clock signal of a high level, the second light emitting control signal of a high level and the third light emitting control signal of a high level and outputs a fifth scan signal of a low level to the fifth scan line Scan[5].

Finally, the sixth NAND gate NAND6 to the $n^{th}$ NAND gate NANDn output the sixth scan signal to the $n^{th}$ scan signal of a high level because the fourth light emitting control line Em[4] to the $n/2^{th}$ light emitting control line Em[n/2] electrically coupled therewith apply light emitting control signals of a low level to the sixth NAND gate NAND6 to the $n^{th}$ NAND gate NANDn.

The first shift register SR1 to the $n/2^{th}$ shift register SRn/2 sequentially output the first light emitting control signal to the $n/2^{th}$ light emitting control signal of a high level using an input signal applied from the first drive period T1 to the third drive period T3 and a previous shift register, and an output signal of a previous drive period.

The first NAND gate NAND1 to the $n^{th}$ NAND gate NANDn sequentially output the first scan signal to the $n^{th}$ scan signal of a low level by the first clock signal to the second clock signal, the initial drive signal and the first light emitting control signal to the $n/2^{th}$ light emitting control signal applied in the first sub drive period T11 and the second sub drive period T12 of the first drive period T1 to the first sub drive period T31 and the second drive period T32 of the third drive period T3. In the first NAND gate NAND1 to the $n^{th}$ NAND gate NANDn, if all of the initial drive signal and the first light emitting control signal to the $n^{th}$ light emitting control signal are high level, and the first clock line applies the first clock signal of a high level, and the second clock line applies the second clock signal of a low level, then all odd-numbered scan signals that are output signals of odd-numbered NAND gates electrically coupled with the second clock line are outputted with a high level. In the first NAND gate NAND1 to the $n^{th}$ NAND gate NANDn, if all of the initial drive signal and the first light emitting control signal to the $n^{th}$ light emitting control signal have a high level, and the first clock line applies the first clock signal of a low level, and the second clock line applies the second clock signal of a high level, then all odd-numbered scan signals that are output signals of odd-numbered NAND gates electrically coupled with the first clock line are outputted with a high level. And, all even-numbered scan signals that are output signals of even-numbered NAND gates electrically coupled with the second clock line are outputted with a low level. Namely, it is possible to output odd-numbered and even-numbered scan signals using the first and second clock signals.

Figure 9:
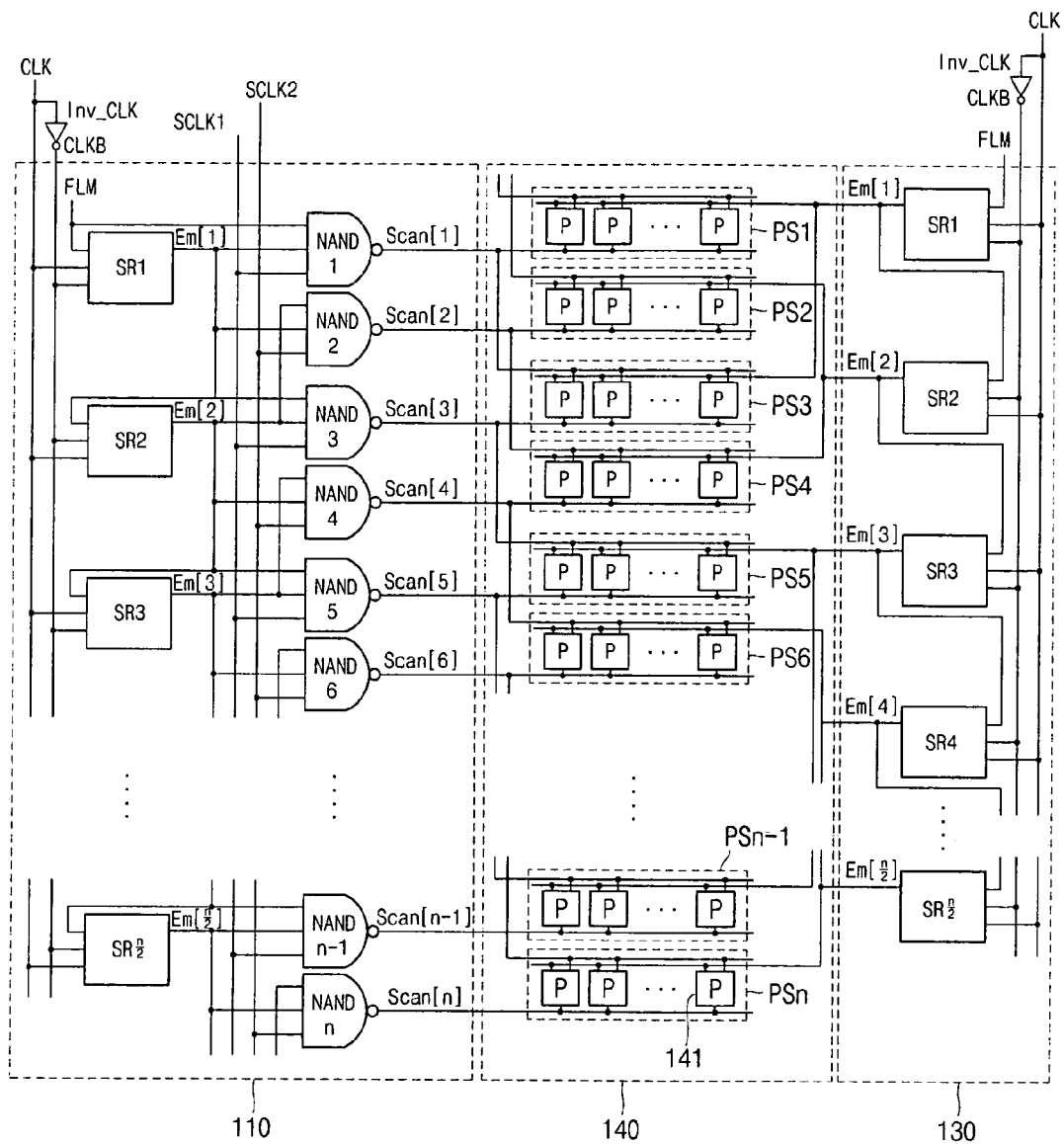
FIG. 9 is a block diagram illustrating an organic light emitting display according to an exemplary embodiment of the present invention.

FIG. 9 is a block diagram illustrating an organic light emitting display according to an embodiment of the present invention.

As shown in FIG. 9, an organic light emitting display includes the scan driver 110, light emitting control driver 130 and the organic light emitting display panel 140.

The scan driver 110 operates as described in reference to FIGS. 7 and 8 and outputs the first scan signal to the $n^{th}$ scan signal to the first scan line Scan[1] to the $n^{th}$ scan line Scan[n]. The first scan line Scan[1] to the $n^{th}$ scan line Scan[n] are electrically coupled with the organic light emitting display panel 140 and apply the first scan signal to the $n^{th}$ scan signal to the organic light emitting display panel 140. At this time, in the first NAND gate NAND1 to the $n^{th}$ NAND gate NANDn of the scan driver of the organic light emitting display of FIG. 7, if all of the initial drive signal and the first light emitting control signal to the $n^{th}$ light emitting control signal are high level, and the first clock line applies the first clock signal of a high level, and the second clock line applies the second clock signal of a low level, then all odd-numbered scan signals that are output signals of odd-numbered NAND gates electrically coupled with the first clock line are outputted with a low level. And, all even-numbered scan signals that are output signals of even-numbered NAND gates electrically coupled with the second clock line are outputted with a high level. In the first NAND gate NAND1 to the $n^{th}$ NAND gate NANDn, if all of the initial drive signal and the first light emitting control signal to the $n^{th}$ light emitting control signal are high level, and the first clock line applies the first clock signal of a low level, and the second clock line applies the second clock signal of a high level, then all odd-numbered scan signals that are output signals of odd-numbered NAND gates electrically coupled with the first clock line are outputted with a high level. And, all even-numbered scan signals that are output signals of even-numbered NAND gates electrically coupled with the second clock line are outputted with a low level. Namely, it is possible to output odd-numbered and even-numbered scan signals in accordance with the first clock signal and the second clock signal applied from the first clock line SCLK1 and the second clock line SCLK 2.

The light emitting control driver 130 operates as described in reference to FIGS. 5 and 6 and outputs the first light emitting control signal to the $n/2^{th}$ light emitting control signal to the first light emitting control line Em[1] to the $n/2^{th}$ light emitting control line Em[n/2]. The first light emitting control line Em[1] to the $n/2^{th}$ light emitting control line Em[n/2] are electrically coupled with the organic light emitting display panel 140 and apply the first light emitting control signal to the $n/2^{th}$ light emitting control signal to the organic light emitting display panel 140. In the light emitting control lines (Em[1], Em[2], . . . , Em[n/2]), an odd-numbered light emitting control line is electrically coupled with an odd-numbered pixel part, and an even-numbered light emitting control line is electrically coupled with an even-numbered pixel part. The odd-numbered light emitting control line applies an odd-numbered light emitting control signal when the odd-numbered pixel part transfers a data signal to an organic light emitting diode OLED by an odd-numbered scan signal applied thereto, so that the odd-numbered light emitting control line simultaneously supplies a light emitting control signal to an odd-numbered pixel part and enables an odd-numbered organic light emitting diode OLED to simultaneously emit light.

The organic light emitting display panel 140 includes the first pixel part PS1 to the $n^{th}$ pixel part PSn. As illustrated in FIG. 9, for example, the term "pixel part" in one embodiment refers to a row of pixels coupled to the same scan line and/or the same emitting control line.

The first pixel part PS1 is electrically coupled with the $-1^{th}$ scan line Scan[-1], the first scan line Scan[1] and the first light emitting control line Em[1]. The second pixel part PS2 is electrically coupled with the $0^{th}$ scan line Scan[0], the second scan line Scan[2] and the second light emitting control line Em[2]. The third pixel part PS3 is electrically coupled with the first scan line Scan[1], the third scan line Scan[3] and the first light emitting control line Em[1]. The fourth pixel part PS4 is electrically coupled with the second scan line Scan[2], the fourth scan line Scan[4] and the second light emitting control line Em[2]. The fifth pixel part PS5 is electrically coupled with the third scan line Scan[3], the fifth scan line Scan[5] and the third light emitting control line Em[3]. The sixth pixel part PS6 is electrically coupled with the fourth scan line Scan[4], the sixth scan line Scan[6] and the fourth light emitting control line Em[4]. In this way, the pixel part is electrically coupled with the $n-2^{th}$ scan line Scan[n-2] and the $n^{th}$ scan line Scan[n] and operates by being supplied with the $n-2^{th}$ scan signal and the $n^{th}$ scan signal. Namely, an even-numbered scan line is electrically coupled with an even-numbered pixel part, and an odd-numbered scan line is electrically coupled with an odd-numbered pixel part. Here, the $-1^{th}$ scan line Scan[-1] and the $0^{th}$ scan line Scan[0] are scan lines of a panel that is inserted into a dead space and is not visible to a user. And, an even-numbered light emitting control line is electrically coupled with an even-numbered pixel part, and an odd-numbered light emitting control line is electrically coupled with an odd-numbered pixel part.

Here, in the first NAND gate NAND1 to the $n^{th}$ NAND gate NANDn of the scan driver 110, if all of the initial drive signal and the first light emitting control signal to the $n^{th}$ light emitting control signal are high level, and the first clock line SCLK1 applies the first clock signal of a high level, and the second clock line SCLK2 applies the second clock signal of a low level, then all odd-numbered scan signals that are output signals of odd-numbered NAND gates electrically coupled with the first clock line SCLK1 are outputted with a low level. And, all even-numbered scan signals that are output signals of even-numbered NAND gates electrically coupled with the second clock line SCLK2 are outputted with a high level. In the first NAND gate NAND1 to the $n^{th}$ NAND gate NANDn, if all of the initial drive signal and the first light emitting control signal to the $n^{th}$ light emitting control signal are high level, and the first clock line SCLK1 applies the first clock signal of a low level, and the second clock line SCLK2 applies the second clock signal of a high level, then all odd-numbered scan signals that are output signals of odd-numbered NAND gates electrically coupled with the first clock line SCLK1 are outputted with a high level. And, all even-numbered scan signals that are output signals of even-numbered NAND gates electrically coupled with the second clock line SCLK2 are outputted with a low level.

When the first clock signal of a high level is applied to the first clock line SCLK1 and the second clock signal of a low level is applied to the second clock line SCLK2, all odd-numbered scan signals are outputted with a low level, so that an odd-numbered pixel circuit operates by being supplied with an odd-numbered scan signal of a low level, and an organic light emitting diode OLED emits light by being supplied with a data signal. At this time, an even-numbered pixel circuit is supplied with an even-numbered scan signal of a high level, and a data signal to be transferred to an organic light emitting diode OLED is blocked.

When the first clock signal of a low level is applied to the first clock line SCLK1 and the second clock signal of a high level is applied to the second clock line SCLK2, all even-numbered scan signals are outputted with a low level, so that an even-numbered pixel circuit operates by being supplied with an even-numbered scan signal of a low level, and an organic light emitting diode OLED emits light by being supplied with a data signal. At this time, an odd-numbered pixel circuit is supplied with an odd-numbered scan signal of a high level, and a data signal to be transferred to an organic light emitting diode OLED is blocked.

Here, the first clock line SCLK1 and the second clock line SCLK2 are electrically coupled with an odd-numbered NAND gate and an even-numbered NAND gate, respectively, and the odd-numbered NAND gate and the even-numbered NAND gate are electrically coupled with an odd-numbered pixel part and an even-numbered pixel part, respectively. At this time, the first clock signal of a low level is applied to the first clock line SCLK1, and the second clock signal of a high level is applied to the second clock line SCLK2, so that only an organic light emitting diode OLED of an odd-numbered pixel part is turned on. And, the first clock signal of a high level is applied to the first clock line SCLK1, and the second clock signal of a low level is applied to the second clock line SCLK2, so that only an organic light emitting diode OLED of an even-numbered pixel part is turned on. In case that an organic light emitting diode OLED of an odd-numbered pixel part emits light, though only an organic light emitting diode OLED of an even-numbered pixel part should emit light, and in case that an organic light emitting diode OLED of an even-numbered pixel part emits light, though only an organic light emitting diode OLED of an odd-numbered pixel part should emit light, it is possible to know that a longitudinal short is occurred.

For example, when the first clock signal of a low level is applied to the first clock line SCLK1 and the second clock signal of a high level is applied to the second clock line SCLK2, an organic light emitting diode OLED of an odd-numbered pixel part should emit light. In this case, however, if a short is occurred in the $m^{th}$ pixel circuit 141 of the first pixel part PS1 and the second pixel part PS2, then an organic light emitting diode OLED of the $m^{th}$ pixel circuit 141 of the second pixel part PS2 also emits light, and thus it is possible to find that a longitudinal short has occurred.

In a conventional pixel circuit, such a longitudinal short is detected by applying a constant pattern to an organic light emitting display panel in a module process, and thus a module process operation cost for a defective panel having a short is additionally needed. However, according to the described embodiment of the present invention, such a longitudinal short is detected by applying a clock signal to a panel before a module process, and thus it is possible to reduce a module process operation cost for a defective panel. And, it is possible to substantially prevent the reliability of a product from being lowered because it is possible to prevent such a circumstance that a longitudinal short cannot be detected as a defect when the total inspection is not performed during a module process and thus the final user detects the defect.

FIG. 10 is a timing diagram illustrating signals of the organic light emitting display of FIG. 9.

As illustrated in FIG. 10, a timing diagram of the organic light emitting display includes a first drive period T1, a second drive period T2 and a third drive period T3. And, each of the first drive period T1 to the third drive period T3 includes a first sub drive period, a delay period and a second sub drive period.

First, in the first drive period T1, a first light emitting control signal of a high level and a second light emitting control signal to a $n^{th}$ light emitting control signal of a low level are applied to the organic light emitting display panel 140.

In the first sub drive period T11 of the first drive period T1, a first scan signal to a $n^{th}$ scan signal of a high level are applied to the organic light emitting display panel 140.

The delay period D1 of the first drive period T1 allows a time interval (e.g., a predetermined time interval) between the applied scan signals in order to enable to secure a margin to clock skew or delay.

In the second sub drive period T12 of the first drive period T1, the first scan signal of a low level and the second scan signal to the $n^{th}$ scan signal of a high level are applied to the organic light emitting display panel 140. At this time, the pixel circuit of the first pixel part PS1 is supplied with the first scan signal of a low level, so that the first switching element S1 and the fifth switching element S5 are turned on. The first switching element S1 is turned on and transfers a data signal to the drive transistor. And, the fifth switching element S5 is turned on and compensates a threshold voltage of the drive transistor by diode-like connecting the drive transistor. The pixel circuit of the first pixel part PS1 stores a voltage difference between the first power supply voltage ELVDD and the control electrode of the drive transistor M1 in the first storage capacitor C1. And, the pixel circuit of the third pixel part PS3 is supplied with the first scan signal of a low level that is the second previous scan signal and initializes a voltage stored in the first storage capacitor C1 and the second storage capacitor C2.

In the second drive period T2, the first light emitting control signal and the second light emitting control signal of a high level and the third light emitting control signal to the $n^{th}$ light emitting control signal of a low level are applied to the organic light emitting display panel 140.

In the first sub drive period T21 of the second drive period T2, the second scan signal of a low level and the first scan signal and the third scan signal to the $n^{th}$ scan signal of a high level are applied to the organic light emitting display panel 140. At this time, the pixel circuit of the second pixel part PS2 is supplied with the second scan signal of a low level, so that the first switching element S1 and the fifth switching element S5 are turned on. The first switching element S1 is turned on and transfers a data signal to the drive transistor. And, the fifth switching element S5 is turned on and compensates a threshold voltage of the drive transistor by diode-like connecting the drive transistor. The pixel circuit of the second pixel part PS2 stores a voltage difference between the first power supply voltage ELVDD and the control electrode of the drive transistor M1 in the first storage capacitor C1. And, the pixel circuit of the fourth pixel part PS4 is supplied with the second scan signal of a low level that is the second previous scan signal and initializes a voltage stored in the first storage capacitor C1 and the second storage capacitor C2.

The delay period D2 of the second drive period T2 allows a time interval (e.g., a predetermined time interval) between the applied scan signals in order to enable to secure a margin to clock skew or delay.

In the second sub drive period T22 of the second drive period T2, the third scan signal of a low level and the first scan signal, the second scan signal and the fourth scan signal to the $n^{th}$ scan signal of a high level are applied to the organic light emitting display panel 140. At this time, the pixel circuit of the third pixel part PS3 is supplied with the third scan signal of a low level, so that the first switching element S1 and the fifth switching element S5 are turned on. The first switching element S1 is turned on and transfers a data signal to the drive transistor. And, the fifth switching element S5 is turned on and compensates a threshold voltage of the drive transistor by diode-like connecting the drive transistor. The pixel circuit of the third pixel part PS3 stores a voltage difference between the first power supply voltage ELVDD and the control electrode of the drive transistor M1 in the first storage capacitor C1. And, the pixel circuit of the fifth pixel part PS5 is supplied with the third scan signal of a low level that is the second previous scan signal and initializes a voltage stored in the first storage capacitor C1 and the second storage capacitor C2.

Finally, in the third drive period T3, the second light emitting control signal and the third light emitting control signal of a high level and the first light emitting control signal and the third light emitting control signal to the $n^{th}$ light emitting control signal of a low level are applied to the organic light emitting display panel 140. The pixel circuit of the first pixel part PS1 is supplied with the first light emitting control signal of a low level, so that the second switching element S2 and the third switching element S3 are turned on. The second switching element S2 is turned on and transfers the first power supply voltage ELVDD to the drive transistor M1, and the third switching element S3 is turned on and transfers a drive current to the organic light emitting diode OLED, and thus the organic light emitting diode OLED of the first pixel part PS1 emits light.

In the first sub drive period T31 of the third drive period T3, the fourth scan signal of a low level and the first scan signal to the third scan signal and the fifth scan signal to the $n^{th}$ scan signal of a high level are applied to the organic light emitting display panel 140. At this time, the pixel circuit of the fourth pixel part PS4 is supplied with the fourth scan signal of a low level, so that the first switching element S1 and the fifth switching element S5 are turned on. The first switching element S1 is turned on and transfers a data signal to the drive transistor. And, the fifth switching element S5 is turned on and compensates a threshold voltage of the drive transistor by diode-like connecting the drive transistor. The pixel circuit of the fourth pixel part PS4 stores a voltage difference between the first power supply voltage ELVDD and the control electrode of the drive transistor M1 in the first storage capacitor C1. Further, the pixel circuit of the sixth pixel part PS6 is supplied with the fourth scan signal of a low level that is the second previous scan signal and initializes a voltage stored in the first storage capacitor C1 and the second storage capacitor C2.

The delay period D3 of the third drive period T3 allows a time interval (e.g., a predetermined time interval) between the applied scan signals in order to enable to secure a margin to clock skew or delay.

In the second sub drive period T32 of the third drive period T3, the fifth scan signal of a low level and the first scan signal to the fourth scan signal and the sixth scan signal to the $n^{th}$ scan signal of a high level are applied to the organic light emitting display panel 140. At this time, the pixel circuit of the fifth pixel part PS5 is supplied with the fifth scan signal of a low level, so that the first switching element S1 and the fifth switching element S5 are turned on. The first switching element S1 is turned on and transfers a data signal to the drive transistor. And, the fifth switching element S5 is turned on and compensates a threshold voltage of the drive transistor by diode-like connecting the drive transistor. The pixel circuit of the fifth pixel part PS5 stores a voltage difference between the first power supply voltage ELVDD and the control electrode of the drive transistor M1 in the first storage capacitor C1. And, the pixel circuit of the seventh pixel part PS7 is supplied with the fifth scan signal of a low level that is the second previous scan signal and initializes a voltage stored in the first storage capacitor C1 and the second storage capacitor C2.

In this way, the first part PS1 to the $n^{th}$ pixel part PSn are sequentially operated, and the organic light emitting diode OLED emits light.

As described above, according to the organic light emitting display in embodiments of the present invention, it is possible to reduce a module process cost by detecting longitudinal short defect of a pixel circuit of an organic light emitting display panel in advance and it is possible to have high reliability.

Although exemplary embodiments of the organic light emitting display of the present invention have been described for illustrative purpose, those skilled in the art will appreciate that various modifications and changes thereof are possible without departing from the scope and spirit of the present invention, and the scope of the invention is defined by the appended claims and their equivalents.

What is claimed is:

1. An organic light emitting display comprising:
   a first shift register electrically coupled with an initial clock line, an initial negative clock line and an initial drive line;
   a second shift register electrically coupled with the initial negative clock line, the initial clock line and a first light emitting control line which is an output line of the first shift register;
   a first NAND gate electrically coupled with the initial drive line, the first light emitting control line, and a first clock line;
   a second NAND gate electrically coupled with the first light emitting control line, a second light emitting control line which is an output line of the second shift register, and a second clock line;
   a first pixel part electrically coupled with a first scan line which is an output line of the first NAND gate;
   a second pixel part electrically coupled with a second scan line which is an output line of the second NAND gate;
   a third pixel part electrically coupled with the first scan line; and
   a fourth pixel part electrically coupled with the second scan line,
   wherein the first NAND gate is electrically coupled with the initial drive line, the first light emitting control line, and the first clock line, and outputs a first scan signal to the first scan line using an initial drive signal, a first light emitting control signal, and a first clock signal, and
   wherein the second NAND gate is electrically coupled with the first light emitting control line, the second light emitting control line, and the second clock line, and outputs a second scan signal to the second scan line using the first light emitting control signal, a second light emitting control signal, and a second clock signal.

2. The organic light emitting display as claimed in claim 1, wherein the first pixel part is electrically coupled with a $-1^{th}$ scan line, the first scan line, and the first light emitting control line.

3. The organic light emitting display as claimed in claim 2, wherein the second pixel part is electrically coupled with a $0^{th}$ scan line, the second scan line, and the second light emitting control line.

4. The organic light emitting display as claimed in claim 3, wherein the third pixel part is electrically coupled with the first scan line, a third scan line, and the first light emitting control line.

5. The organic light emitting display as claimed in claim 4, wherein the fourth pixel part is electrically coupled with the second scan line, a fourth scan line, and the second light emitting control line.

6. The organic light emitting display as claimed in claim 1, wherein a pixel circuit of at least one of the first pixel part, the second pixel part, the third pixel part, or the fourth pixel part, comprises:
   a first switching element electrically coupled between a first power supply voltage line and a data line, and having a control electrode electrically coupled to the first scan line or the second scan line;
   a second switching element electrically coupled between the first switching element and the first power supply voltage line, and having a control electrode electrically coupled to the first light emitting control line or the second light emitting control line;
   a drive transistor electrically coupled between the first switching element and a second power supply voltage line;
   a first storage capacitor electrically coupled between the first power supply voltage line and a third power supply voltage line;
   a second storage capacitor electrically coupled between the first scan line or the second scan line, and a control electrode of the drive transistor;
   a third switching element electrically coupled between the drive transistor and the second power supply voltage line, and having a control electrode electrically coupled with the first light emitting control line or the second light emitting control line;
   a fourth switching element electrically coupled between the first storage capacitor and the third power supply voltage line, and having a control electrode electrically coupled with a second previous scan line;
   a fifth switching element electrically coupled between the control electrode of the drive transistor and the third switching element; and
   an organic light emitting diode electrically coupled between the third switching element and the second power supply voltage line.

7. The organic light emitting display as claimed in claim 6, wherein the first switching element has a first electrode electrically coupled with the data line, and a second electrode electrically coupled with the second switching element and the drive transistor.

8. The organic light emitting display as claimed in claim 6, wherein the second switching element has a first electrode electrically coupled with the first switching element and the drive transistor, and a second electrode electrically coupled with the first power supply voltage line and the first storage capacitor.

9. The organic light emitting display as claimed in claim 6, wherein the third switching element has a first electrode electrically coupled with the drive transistor and the fifth switching element, and a second electrode electrically coupled with an anode of the organic light emitting diode.

10. The organic light emitting display as claimed in claim 6, wherein the fourth switching element has a first electrode electrically coupled with the first storage capacitor and the control electrode of the drive transistor, and a second electrode electrically coupled with the third power supply voltage line.

11. The organic light emitting display as claimed in claim 6, wherein the fifth switching element has a first electrode electrically coupled with the control electrode of the drive transistor, a second electrode electrically coupled with the drive transistor and the third switching element, and a control electrode electrically coupled with the first scan line or the second scan line.

12. The organic light emitting display as claimed in claim 6, wherein the drive transistor has a first electrode electrically coupled with the first switching element and the second switching element, and a second electrode electrically coupled with the third switching element.

13. The organic light emitting display as claimed in claim 1, wherein at least one of the shift registers comprises:
a first PMOS switching element having a control electrode electrically coupled with the initial clock line, and adapted to supply a first power supply voltage;
a second PMOS switching element electrically coupled between the first PMOS switching element and a first node, and having a control electrode electrically coupled with an input line;
a first NMOS switching element having a control electrode electrically coupled with the initial negative clock line, and adapted to supply a second power supply voltage;
a second NMOS switching element electrically coupled between the first NMOS switching element and the first node, and having a control electrode electrically coupled with the input line;
a third PMOS switching element having a control electrode electrically coupled with the initial negative clock line, and adapted to supply the first power supply voltage;
a fourth PMOS switching element electrically coupled between the third PMOS switching element and the first node, and having a control electrode electrically coupled with a second node;
a third NMOS switching element having a control electrode electrically coupled with the initial clock line, and adapted to supply the second power supply voltage;
a fourth NMOS switching element electrically coupled between the third NMOS switching element and the first node, and having a control electrode electrically coupled with the second node;
a fifth PMOS switching element electrically coupled between the first power supply voltage line and the second node, and having a control electrode electrically coupled with the first node; and
a fifth NMOS switching element electrically coupled between the second power supply voltage line and the second node, and having a control electrode electrically coupled with the first node.

14. The organic light emitting display as claimed in claim 13, wherein a signal of the second node is an output signal of the shift register.

15. The organic light emitting display as claimed in claim 1, wherein the first clock line is electrically coupled with an odd-numbered NAND gate among the NAND gates.

16. The organic light emitting display as claimed in claim 15, wherein when the first clock signal of a low level is applied to the first clock line and the second clock signal of a high level is applied to the second clock line, a scan signal of a low level is applied to an odd-numbered pixel circuit of the pixel parts, so that a data signal is applied to the odd-numbered pixel circuit.

17. The organic light emitting display as claimed in claim 16, wherein when a light emitting control signal of a low level is applied to the odd-numbered pixel circuit, the odd-numbered pixel circuit emits light.

18. The organic light emitting display as claimed in claim 1, wherein the second clock line is electrically coupled with an even-numbered NAND gate among the NAND gates.

19. The organic light emitting display as claimed in claim 18, wherein when the first clock signal of a high level is applied to the first clock line and the second clock signal of a low level is applied to the second clock line, a scan signal of a low level is applied to an even-numbered pixel circuit of the pixel parts, so that a data signal is applied to the even-numbered pixel circuit.

20. The organic light emitting display as claimed in claim 19, wherein when a light emitting control signal of a low level is applied to the even-numbered pixel circuit, the even-numbered pixel circuit emits light.

21. The organic light emitting display as claimed in claim 1, wherein the first shift register has an input terminal electrically coupled with the initial drive line, a first clock terminal electrically coupled with the initial clock line, a second clock terminal electrically coupled with the initial negative clock line, and an output terminal electrically coupled with the first light emitting control line.

22. The organic light emitting display as claimed in claim 1, wherein the second shift register has an input terminal electrically coupled with the first light emitting control line, a first clock terminal electrically coupled with the initial negative clock line, a second clock terminal electrically coupled with the initial clock line, and an output terminal electrically coupled with the second light emitting control line.

23. The organic light emitting display as claimed in claim 1, further comprising a clock inverter electrically coupled with the initial clock line, and adapted to provide an initial negative clock signal to the initial negative clock line using an initial clock signal.

* * * * *